United States Patent [19]

Campbell

[11] Patent Number: 5,459,437
[45] Date of Patent: Oct. 17, 1995

[54] LOGIC GATE WITH CONTROLLABLE HYSTERESIS AND HIGH FREQUENCY VOLTAGE CONTROLLED OSCILLATOR

[75] Inventor: David L. Campbell, Sunnyvale, Calif.

[73] Assignee: Integrated Device Technology, Santa Clara, Calif.

[21] Appl. No.: 241,241

[22] Filed: May 10, 1994

[51] Int. Cl.$^6$ .............................. H03K 3/03; H03K 3/354; H03L 7/099
[52] U.S. Cl. .............................. 331/111; 327/206; 331/17; 331/25; 331/34; 331/60; 331/143; 331/177 R
[58] Field of Search .................................. 331/111, 143, 331/177 R

[56] References Cited

U.S. PATENT DOCUMENTS 4,301,427  11/1981  Suzuki et al. ........................... 331/111
4,689,581  8/1987  Talbot .................................... 331/111 X

OTHER PUBLICATIONS

Low Skew CMOS PLL Clock Driver 100 MHz Version, MC88915T, Motorola Semiconductor Technical Data, pp. 67–77.

Primary Examiner—Siegfried H. Grimm
Attorney, Agent, or Firm—Skjerven, Morrill, MacPherson, Franklin & Friel

[57] ABSTRACT

A hysteresis circuit comprises a first logic section, a second logic section cascaded with the first logic section, and circuitry for controlling hysteresis threshold voltages of the hysteresis circuit. The hysteresis controlling circuitry conducts current from a source of a first supply voltage to the output lead of the first logic section during a low-to-high transition of an input voltage on an input terminal of the hysteresis circuit. The hysteresis controlling circuitry conducts current from the output lead of the first logic section to a source of a second supply voltage during a high-to-low transition of the input voltage on the input terminal of the hysteresis circuit. A clock generator integrated circuit chip employing the hysteresis circuit in a voltage controlled oscillator can generate squarewave signals of 150 MHz onto a plurality of output terminals when powered from approximately 3.3 volts throughout a 0 to 70 degree Celsius temperature range, a clock skew of less than 0.5 nanosecond existing between the squarewave signals on the output terminals.

16 Claims, 14 Drawing Sheets

Output Characteristic of a Field Effect Transistor

LOGIC GATE WITH CONTROLLABLE HYSTERESIS AND HIGH FREQUENCY VOLTAGE CONTROLLED OSCILLATOR

FIELD OF THE INVENTION

This invention relates to hysteresis circuits, and more specifically, to logic gate circuits with controlled hysteresis and to high frequency oscillators using controlled hysteresis circuits.

BACKGROUND INFORMATION

FIG. 1 (Prior Art) shows a 5 volt digital inverter 1 with hysteresis. Hysteresis is commonly used to reduce sensitivity to noise on input signals of a circuit and/or to control the propagation delays of signals passing through a circuit. In this example, when the output voltage $V_{out}$ supplied on output terminal 2 of inverter 1 is approximately 5.0 volts (i.e., a logic 1), $V_{out}$ will not transition to approximately 0 volts (i.e., a logic 0) unless the input voltage $V_{in}$ on input terminal 3 is increased to 2.6 volts or greater. The threshold voltage necessary during a transition from a logic 0 to a logic 1 on input terminal 3 to begin switching $V_{out}$ from a logic 1 to a logic 0 is hereinafter referred to as $V_{T01}$. In this example, $V_{T01}$ is 2.6 volts.

On the other hand, when $V_{out}$ is at a logic 0, $V_{out}$ will not begin switching to a logic 1 unless voltage $V_{in}$ is 2.4 volts or lower. The threshold voltage necessary during a transition from a logic 1 to a logic 0 on input terminal 3 to begin switching $V_{out}$ from a logic 0 to a logic 1 is hereinafter referred to as $V_{T10}$. In this example, $V_{T10}$ is 2.4 volts.

Digital inverters generally do not have well controlled hysteresis threshold voltages, $V_{T01}$ and $V_{T10}$. The two hysteresis threshold voltages $V_{T01}$ and $V_{T10}$ may only be a few tenths of a volt apart and may be at undesirable voltages.

FIG. 2 (Prior Art) shows an idealized non-hysteresis inverter 4 comprising a P-channel field effect transistor (FET) 5 and an N-channel FET 6. P-channel FET 5 has its gate connected to input terminal 7, its source connected to supply voltage $V_{CC}$, and its drain connected to output terminal 8. N-channel FET 6 has its gate connected to input terminal 7, its source connected to ground, and its drain connected to output terminal 8. The operation of inverter 4, with no load on output terminal 8, is as follows.

An input voltage $V_{in}$ present on input terminal 7 causes inverter 4 to generate an output signal $V_{out}$ on the output terminal 8 according to the hysteresis transfer characteristic illustrated in FIG. 3 as waveform W1.

FIG. 4 illustrates an output characteristic of a field effect transistor. N-channel FET 6 (FIG. 2), for example, will not conduct significant drain current $I_D$ when its gate-to-source voltage $V_{GS}$ is below its threshold voltage $V_{TN}$. This threshold (voltage $V_{TN}$) refers to a condition different from the hysteresis threshold (voltages $V_{T10}$ and $V_{T01}$) described above. $V_{TN}$ refers to the minimum gate-to-source voltage necessary to accumulate electrons in the P-type semiconductor to create an N-type channel connecting the source and drain. This N-type channel allows the N-channel FET to conduct current. FIG. 4 shows that at a given drain-to-source voltage $V_{DS}$, current $I_D$ flowing through the FET increases as $V_{GS}$ increases.

When the input voltage $V_{in}$ on the input terminal 7 of inverter 4 of FIG. 2 is a logic 1, $V_{GS}$ of N-channel FET 6 is equal to $V_{CC}$ so that N-channel FET 6 is conductive. $V_{GS}$ of P-channel FET 5, on the other hand, is zero so that P-channel FET 5 is nonconductive. Output voltage $V_{out}$ on output terminal 8 is therefore a logic 0.

As the input voltage $V_{in}$ decreases, the magnitude of the gate-to-source voltage of P-channel FET 5 increases. Eventually the magnitude of the gate-to-source voltage of P-channel FET 5 reaches the threshold voltage of P-channel FET 5 where P-channel FET 5 begins to conduct current. N-channel FET 6 is conductive because its $V_{GS}$ is still approximately $V_{CC}$, and will continue to conduct while its $V_{GS}$ is greater than its $V_{TN}$. Current therefore begins to flow from $V_{CC}$ to ground but is limited by the conductivity of P-channel FET 5. In this condition, $V_{DS}$ of P-channel FET 5 is approximately $V_{CC}$ and $V_{GS}$ is at threshold so P-channel FET 5 is in its saturation region of operation. Because $V_{DS}$ across N-channel FET 6 is approximately zero volts and because the current through N-channel FET 6 must be the same as the current through P-channel FET 5, N-channel FET 6 is seen to be operating in its linear region of operation. This condition is shown as point 9 in FIG. 3. As $V_{in}$ is lowered further, the voltage $V_{out}$ begins to rise as is shown in FIG. 3 by portion 10 of the waveform W1 in FIG. 3.

In the example non-hysteresis inverter 4 of FIG. 2, when the input voltage $V_{in}$ equals 0.5 $V_{CC}$, the gate-to-source voltages on P-channel FET 5 and N-channel FET 6 are equal. Because the drain current $I_D$ through both transistors must be identical, both transistors must be operating at the same location on the $V_{GS}$=0.5 $V_{CC}$ curve in FIG. 4 where $V_{DS}$=0.5 $V_{CC}$. At this point, shown as point 11 on waveform W1 in FIG. 3, both transistors are in saturation. The input voltage $V_{in}$ required to drive both FETs into saturation is referred to hereinafter as the inverter's logic threshold voltage, $V_{TI}$.

As the input voltage $V_{in}$ continues to drop, the current that N-channel FET 6 can conduct continues to drop because the gate-to-source voltage $V_{GS}$ of N-channel FET 6 is reduced. Conversely, the magnitude of the gate-to-source voltage $V_{GS}$ of P-channel FET 5 is increased. Because the drain current through the two transistors must be identical, P-channel FET 5 enters its linear region of operation whereas N-channel FET 6 remains saturated. As a result, the output voltage $V_{out}$ continues to increase as is indicated by portion 12 of the waveform W1 in FIG. 3.

As the input voltage $V_{in}$ is further reduced, the gate-to-source voltage $V_{GS}$ of N-channel FET 6 decreases below its threshold voltage $V_{TN}$. N-channel FET 6 therefore becomes nonconductive. This condition is indicated by point 13 on waveform W1 in FIG. 3.

FIG. 5 (Prior Art) shows a hysteresis buffer circuit 20. The output lead 21 of a first inverter 22 is coupled to the input lead 23 of a second inverter 24 at node N1. A P-channel FET 26 has its gate connected to the output lead 27 of second inverter 24 at node N2, its source connected to the supply voltage $V_{CC}$, and its drain connected to node N1. An N-channel FET 29 has its gate connected to the output lead 27 of inverter 24 at node N2, its source connected to ground, and its drain connected to node N1. Hysteresis circuit 20 is useful in applications where only a small amount of hysteresis is sufficient.

FETs 26 and 29 control the hysteresis threshold voltages of the hysteresis buffer circuit 20. When the input voltage $V_{in}$ on input terminal 30 is static at a logic 1, the voltage on node N1 is static at a logic 0. The output voltage $V_{out}$ on output terminal 31 is therefore a static logic 1. P-channel FET 26 is therefore turned off and N-channel FET 29 is turned on.

As the input voltage $V_{in}$ begins to transition downward to a logic 0, P-channel FET 35 begins conducting current. However, because N-channel FET 29 is on at this point due to the output voltage of inverter 24 still being a logic 1, current flows from $V_{CC}$ through P-channel FET 35 and is conducted to ground through both N-channel FETs 29 and 36.

As the input voltage $V_{in}$ decreases further, P-channel FET 35 is made to conduct more current because the magnitude of the gate-to-source voltage $V_{GS}$ of P-channel FET 35 increases. At some point, $V_{in}$ drops low enough so that N-channel FET 36 stops operating in its linear region and begins operating in its saturation region. Because the current from P-channel FET 35 is divided between N-channel FETs 29 and 36, P-channel FET 35 must conduct more current (i.e., $V_{in}$ must be lower) than in the previous example explained in connection with FIG. 2 to conduct the combined current conducted by N-channel FETs 29 and 36. Thus, the threshold voltage of hysteresis buffer circuit 20 for high-to-low input voltage transitions (i.e., $V_{T10}$ of hysteresis buffer circuit 20) is lower than the 0.5 $V_{CC}$ threshold voltage $V_{TI}$ of inverter 4 of FIG. 2. Waveform W2 in FIG. 3 illustrates that for a high-to-low input voltage $V_{in}$ transition, the input voltage $V_{in}$ must be lower (see point 40) than 0.5 $V_{CC}$ to cause the voltage on node N1 to have a voltage of 0.5 $V_{CC}$.

A further drop in input voltage $V_{in}$ causes N-channel FET 36 to conduct less current so that N-channel FETs 36 and 29 together do not conduct the current conducted by P-channel FET 35, thereby causing the voltage on node N1 to transition to a logic 1. Second inverter 24 therefore causes voltage $V_{out}$ to transition to a logic 0 which in turn causes N-channel FET 29 to turn off and P-channel FET 26 to turn on.

For a low-to-high voltage transition on input terminal 30, the process is similar to that described above. P-channel FETs 26 and 35 are initially conductive and the voltage on node N1 is initially a logic 1. As $V_{in}$ increases, N-channel FET 36 starts to conduct current. Current flows from $V_{CC}$ through P-channel FETs 26 and 35 to node N1 and through N-channel FET 36 to ground. Eventually N-channel FET 36 will conduct as much current as P-channel FETs 26 and 35. Because the current conducted by N-channel FET 36 is divided between P-channel FETs 26 and 35, $V_{in}$ must be higher than required in the inverter 4 of FIG. 2 to cause the voltage on node N1 to be 0.5 $V_{CC}$. Waveform W3 in FIG. 3 illustrates that for a low-to-high input voltage $V_{in}$ transition, the input voltage $V_{in}$ must be higher (see point 41) than 0.5 $V_{CC}$ to cause the voltage on node N1 to have a voltage of 0.5 $V_{CC}$. Point 41 is the threshold voltage of hysteresis buffer circuit 20 for low-to-high input voltage transitions (i.e., $V_{T01}$ of hysteresis buffer circuit 20).

Hysteresis buffer circuit 20 may, however, malfunction. Proper operation of hysteresis buffer circuit 20 depends on the saturation current of each of transistors 26, 29, 35 and 36, which may vary with the manufacturing process. If, for example, N-channel FET 29 is made too large, then on a high-to-low input voltage transition N-channel FET 29 may be able to conduct any current that P-channel FET 35 can provide (N-channel FET 29 will not go into saturation). In this condition, no input voltage $V_{in}$ could cause the voltage on node N1 to transition from a logic 0 to a logic 1. As a result, the output voltage $V_{out}$ would not transition despite the input voltage $V_{in}$ transitioning.

This problem is more likely to arise when a large hysteresis is desired. In hysteresis circuit 20, to increase $V_{T10}$, N-channel FET 29 must be made larger. Due to variations in the manufacturing process, making N-channel FET 29 larger increases the probability that the saturation current of N-channel FET 29 will be large enough to cause the malfunction described above. Thus, this problem limits the amount of hysteresis that can be achieved.

Further, because saturation current varies with temperature, hysteresis buffer circuit 20 may also malfunction in the manner described above due to changes in temperature. Thus, hysteresis circuit 20 may operate properly at room temperature but malfunction at a different temperature due to different temperature coefficients between N-channel and P-channel transistors comprising hysteresis circuit 20.

FIG. 6 (Prior Art) illustrates an application for hysteresis buffer circuit 20 in a voltage controlled oscillator 50. Input lead 52 of inverter 51 is coupled to output terminal 31 of hysteresis buffer circuit 20. The output signal of inverter 51 is connected to output terminal 53 and also controls the switching of switch 63. Switch 63 couples either ground potential or variable control voltage $V_{CONTROL}$ to node N3. Node N3 is coupled to one end of resistor 64, and the other end of resistor 64 is connected to input terminal 30 of hysteresis circuit 20. Capacitor 65 is coupled between input terminal 30 and ground.

Voltage controlled oscillator 50 operates as follows. The voltage across capacitor 65 is the input voltage $V_{in}$ to hysteresis buffer circuit 20. When voltage $V_{in}$ is a logic 0 (i.e., node N3 is coupled to ground by switch 63 and capacitor 65 is discharged), $V_{out}$ at output terminal 53 is at a logic 1. Consequently, switch 63 is controlled to couple control voltage $V_{control}$ to capacitor 65 through resistor 64. As capacitor 65 charges, voltage $V_{in}$ increases until $V_{in}$ reaches hysteresis voltage threshold $V_{T01}$ of hysteresis buffer circuit 20. Voltage $V_{out}$ at output terminal 53 then transitions to a logic 0. This in turn causes switch 63 to decouple voltage $V_{control}$ from node N3 and to couple node N3 to ground. Accordingly, voltage $V_{in}$ decreases as capacitor 65 discharges. When voltage $V_{in}$ decreases to hysteresis threshold voltage $V_{T01}$, voltage $V_{out}$ transitions back to a logic 1. Voltage $V_{CONTROL}$ can be varied to control the rate at which capacitor 65 is charged and discharged. Increasing voltage $V_{CONTROL}$ causes the voltage across capacitor 65 to increase more quickly and, hence, to reach voltage threshold $V_{T01}$ more quickly.

The hysteresis voltage thresholds $V_{T01}$ and $V_{T10}$ of hysteresis buffer circuit 20 are two of the parameters controlling the frequency and duty cycle of the signal $V_{out}$ output by voltage controlled oscillator 50. However, the shortcomings of hysteresis buffer circuit 20 described above make it undesirable to use in such applications. Voltage controlled oscillator 50 also has a high power dissipation because each transition of an inverter in voltage controlled oscillator 50 dissipates power.

SUMMARY

In accordance with this invention, a hysteresis circuit with controllable hysteresis comprises a first logic section, a second logic section cascaded with the first logic section, and circuitry for controlling an input hysteresis voltage threshold of the hysteresis circuit to be at a desired level.

In accordance with some embodiments, the first logic section is a first inverter comprising a P-channel transistor and an N-channel transistor, the second logic section is a second inverter, and the hysteresis controlling circuitry comprises a P-channel section and an N-channel section.

The hysteresis controlling circuitry conducts current through the P-channel section to the first inverter's N-channel transistor during a low-to-high transition of an input voltage present on an input terminal of the hysteresis circuit and then shuts off the current when an output voltage on an output terminal of the hysteresis circuit completes a low-to-high transition. By setting the width-to-length ratio of P-channel transistors in the P-channel section, and the width-to-length ratio of the N-channel transistor in the first inverter, the low-to-high input hysteresis voltage threshold can be set to a desired voltage level.

The hysteresis controlling circuitry also conducts current through the N-channel section during a high-to-low transition of an input voltage present on the input terminal of the hysteresis circuit and then shuts off the current when an output voltage on the output terminal of the hysteresis circuit completes a high-to-low transition. By setting the width-to-length ratio of N-channel transistors in the N-channel section and the width-to-length ratio of the P-channel transistor in the first inverters, the high-to-low input hysteresis voltage threshold can be set to a desired level.

A hysteresis circuit according to this embodiment can achieve a large hysteresis with accurately controlled hysteresis voltage threshold without malfunctioning as previously described.

In an embodiment of this invention, a voltage controlled oscillator utilizes a hysteresis buffer circuit. By controlling the input voltage hysteresis voltage thresholds, the duty cycle of the voltage controlled oscillator can be more easily controlled and the circuitry needed to implement the voltage controlled oscillator can be optimized to achieve much higher output frequencies than other CMOS voltage controlled oscillators.

According to another embodiment in this invention, a clock generator integrated circuit chip utilizes a voltage controlled oscillator as described above to generate high frequency clock signals. Equalized signal path routing is used to provide multiple matched clock output signals on respective output terminals, each of the multiple clock output signals having a skew of less than 0.25 nanosecond at 100 MHz with respect to each of the other clock output signals. The clock generator integrated circuit chip generates square wave clock signals having frequencies up to 150 MHz when supplied with a 3.3 volt supply voltage over a temperature range of 0 to 75 degrees Celsius.

DETAILED DESCRIPTION

Figure 7:
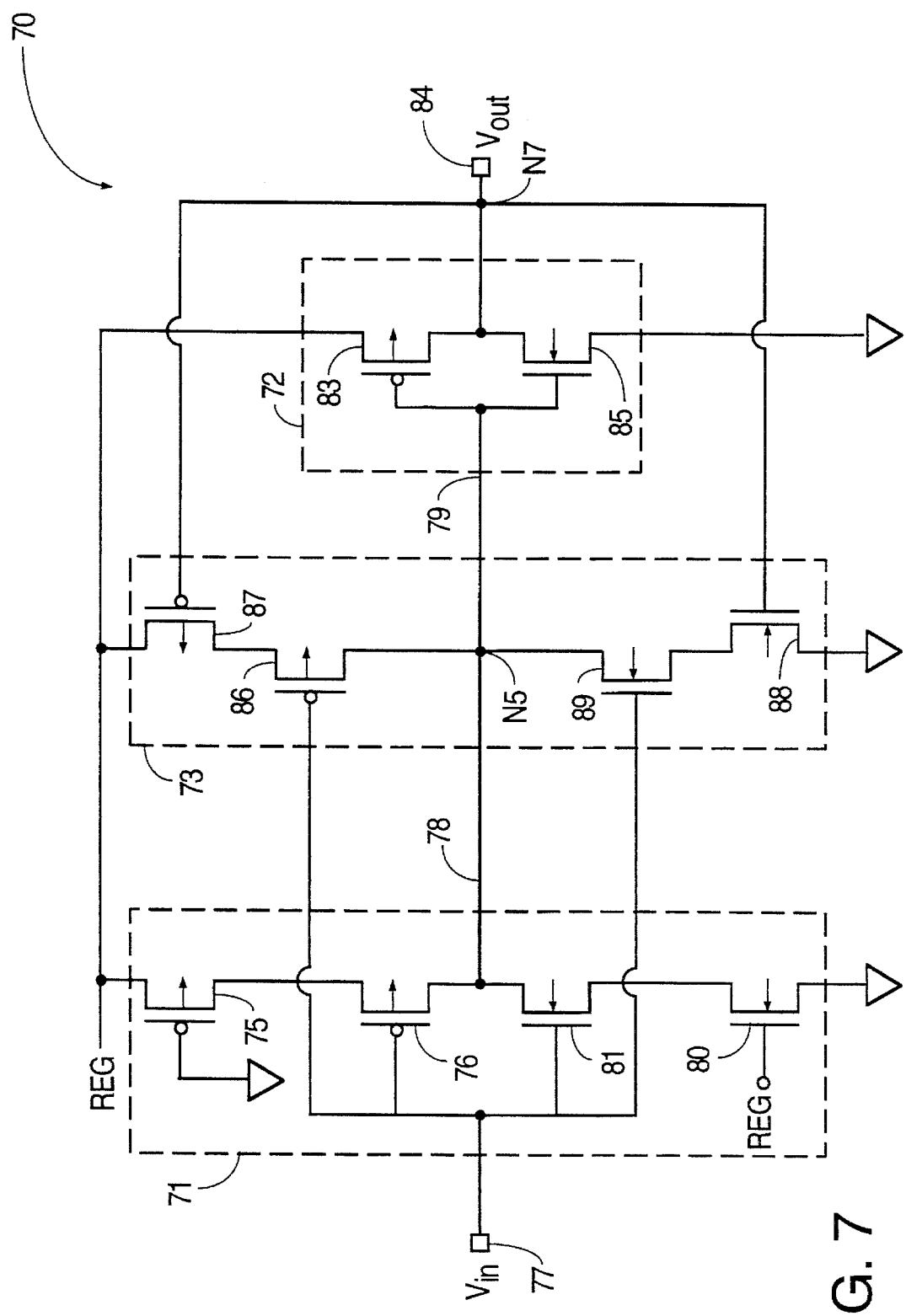
FIG. 7 is an electrical circuit schematic of a hysteresis buffer circuit in accordance with an embodiment of the present invention.

FIG. 7 is an electrical circuit schematic of a hysteresis buffer circuit 70 in accordance with an embodiment of the present invention. The hysteresis buffer circuit 70 comprises a first inverter 71, a second inverter 72, and a hysteresis control circuit 73.

First inverter 71 comprises a first P-channel FET 75 having its gate connected to ground, its source connected to a source of a regulated voltage denoted REG (hereinafter denoted "REG supply") in FIG. 7, and its drain connected to the source of a second P-channel FET 76. Second P-channel FET 76 has its gate connected to input terminal 77, its source connected to the drain of first P-channel FET 75, and its drain connected to the output lead 78 of first inverter 71. The output lead 78 of first inverter 71 is connected to the input lead 79 of second inverter 72 at node N5.

First inverter 71 also comprises a first N-channel FET 80 having its gate coupled to the REG supply, its source coupled to ground, and its drain connected to the source of a second N-channel FET 81. Second N-channel FET 81 has its gate connected to input terminal 77, its source connected to the drain of first N-channel FET 80, and its drain connected to the output lead 78 of first inverter 71.

Second inverter 72 comprises a P-channel FET 83 and an N-channel FET 85. P-channel FET 83 has its gate connected to the output lead 78 of first inverter 71, its source coupled to the REG supply, and its drain connected to the output terminal 84 of hysteresis buffer circuit 70. N-channel FET 85 has its gate connected to the output lead of first inverter 71, its source coupled to ground, and its drain connected to the output terminal 84.

Hysteresis control circuit 73 comprises transistors 86–89. P-channel FET 86 has its gate connected to the input terminal 77, its drain connected to the output lead 78 of first inverter 71 at a node N5, and its source connected to the drain of P-channel FET 87. P-channel FET 87 has its source coupled to the REG supply, its gate connected to the output terminal 84 at a node N7, and its drain connected to the source of P-channel FET 86. N-channel FET 88 has its gate connected to the output terminal 84 at node N7, its source coupled to ground, and its drain connected to the source of N-channel FET 89. N-channel FET 89 has its gate connected to the input terminal 77, its source connected to the drain of N-channel FET 88, and its drain connected to node N5.

Hysteresis buffer circuit 70, when no load is connected to output terminal 84 operates as follows. When input voltage $V_{in}$ on input terminal 77 is static at a logic 1, the voltage input to inverter 72 is static at a logic 0. The output voltage $V_{out}$ is therefore at a logic 1. P-channel FET 87 is therefore turned off and N-channel FET 88 is turned on. Hysteresis buffer circuit 70 is in the logic 1 output state, and no current is flowing through FETs 86–89.

Figure 1:
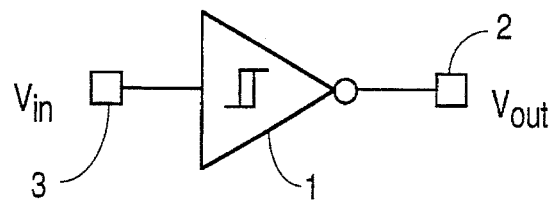
FIG. 1 (PRIOR ART) is a block diagram of a digital inverter with hysteresis.
Figure 2:
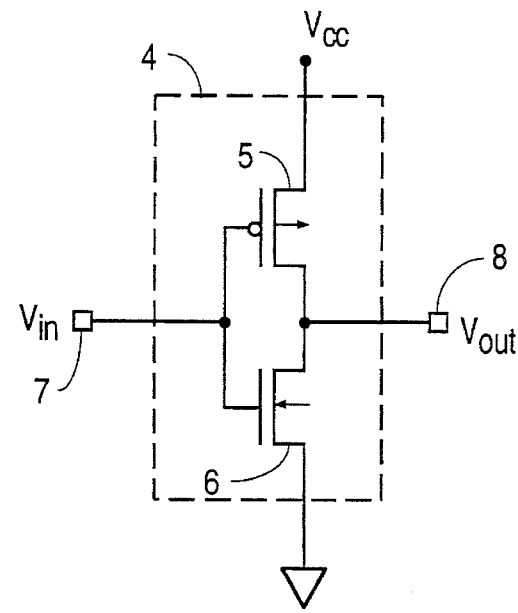
FIG. 2 (PRIOR ART) is an electrical circuit schematic of an inverter implemented with FETs.
Figure 3:
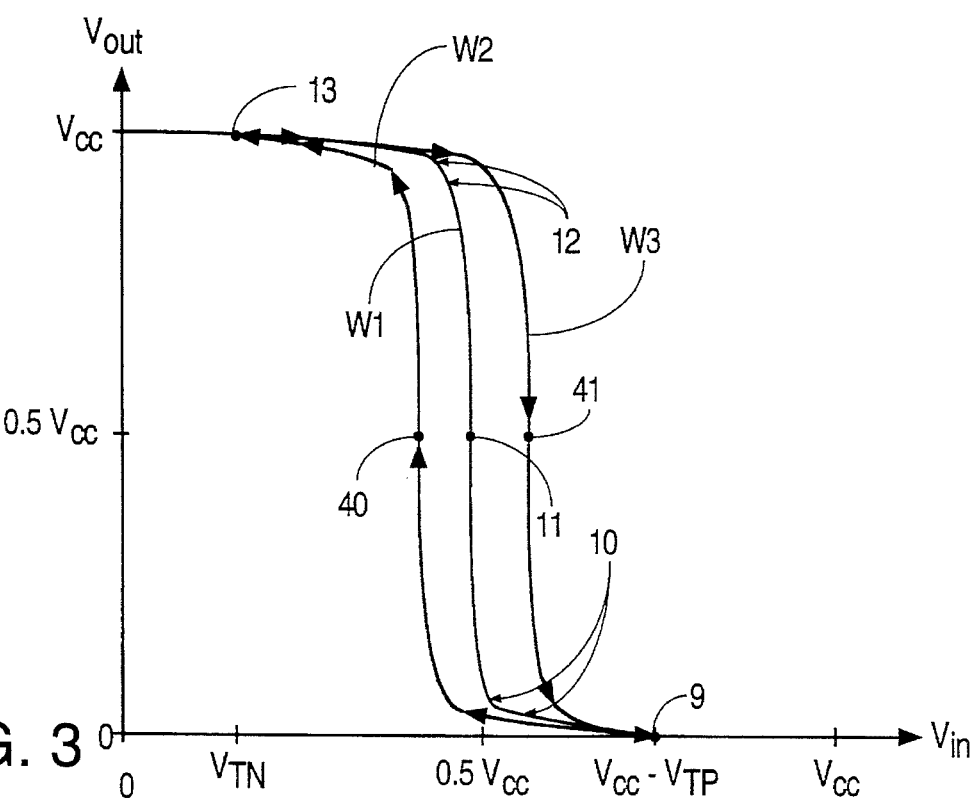
FIG. 3 is a graph of a transfer characteristic of an inverter.
Figure 4:
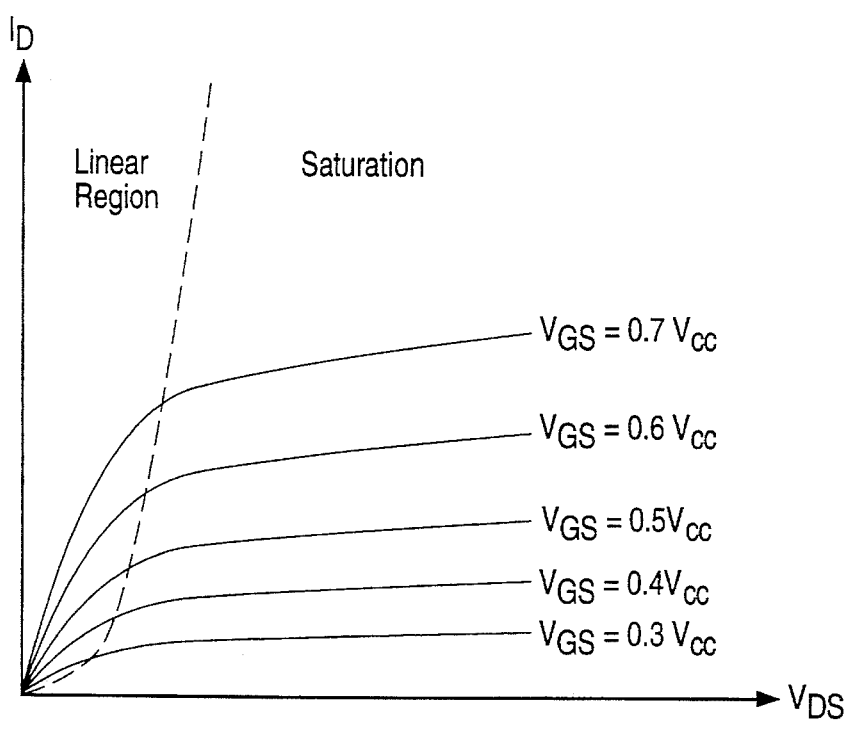
FIG. 4 is a graph of an output characteristic of a field effect transistor.

As $V_{in}$ is lowered during a high-to-low transition of input voltage $V_{in}$, the magnitude of the gate-to-source voltage of P-channel FET 76 increases and eventually reaches the threshold voltage $V_{TP}$ of P-channel FET 76. This condition is represented as point 9 in FIG. 3.

Because N-channel FET 88 is conductive (because $V_{out}$ is still logic 1), current begins to flow through P-channel FETs 75 and 76 and is conducted by N-channel FETs 80, 81, 88, and 89 to ground. As the input voltage $V_{in}$ decreases further, P-channel FET 76 conducts an increasing amount of current which is conducted by N-channel FETs 80, 81, 88 and 89. P-channel FET 86 does not affect the threshold voltage of the hysteresis buffer circuit 70 in this condition because P-channel FET 87 which is coupled in series with P-channel FET 86 is controlled to be nonconductive due to the gate of P-channel FET 87 being coupled to output voltage $V_{out}$.

When $V_{in}$ drops further, the current conducted through P-channel FET 76 increases thereby causing N-channel FETs 81 and 89 to saturate. Because the current from P-channel FET 76 is being divided between the path formed by FETs 80 and 81 and the path formed by FETs 88 and 89, P-channel FET 76 must conduct more current (i.e., $V_{in}$ must be lower) to drive N-channel FETs 81 and 89 into saturation than if N-channel FETs 88 and 89 were not present. This value of $V_{in}$ is the $V_{T10}$ of hysteresis buffer circuit 70.

As $V_{in}$ drops further, the gate-to-source voltages of N-channel FETs 81 and 89 fall below their respective threshold voltages. N-channel FETs 81 and 89 therefore become nonconductive, causing the voltage on the output lead 78 of inverter 71 to be a logic 1. This causes inverter 72 to cause the output voltage $V_{out}$ on output terminal 84 to be a logic 0. N-channel FET 88 is therefore turned off and P-channel FET 87 is turned on.

Hysteresis buffer circuit 70 operates in a similar fashion for a low-to-high voltage transition of input voltage $V_{in}$. When input voltage $V_{in}$ is static at a logic 0, inverter 71 outputs a logic 1, and inverter 72 outputs a logic 0. N-channel FET 88 is therefore controlled to be nonconductive and P-channel FET 87 is controlled to be conductive.

As $V_{in}$ increases, N-channel FET 81 starts to conduct. Current therefore flows from the REG supply, through P-channel FETs 75, 76, 86 and 87, through N-channel FETs 81 and 80, and to ground. As $V_{in}$ increases further, N-channel FET 81 conducts more current until P-channel FETs 76 and 86 saturate. Because the current conducted by N-channel FET 81 is divided between the current path formed by P-channel FETs 75 and 76 and the path formed by P-channel FETs 86 and 87, $V_{in}$ must be higher to drive P-channel FETs 76 and 86 into saturation than if P-channel FETs 86 and 87 were not present. This value of $V_{in}$ is the $V_{T01}$ of hysteresis buffer circuit 70.

As $V_{in}$ increases further, the gate-to-source voltages on P-channel FETs 76 and 86 falls below the threshold voltages of the P-channel FETs 76 and 86 so that the P-channel FETs 76 and 86 become nonconductive. Inverter 71 therefore outputs a logic 0 onto the input lead 79 of inverter 72. Inverter 72 therefore causes output voltage $V_{out}$ to be a logic 1. P-channel FET 87 is therefore controlled to be nonconductive and N-channel FET 88 is controlled to conductive.

Figure 5:
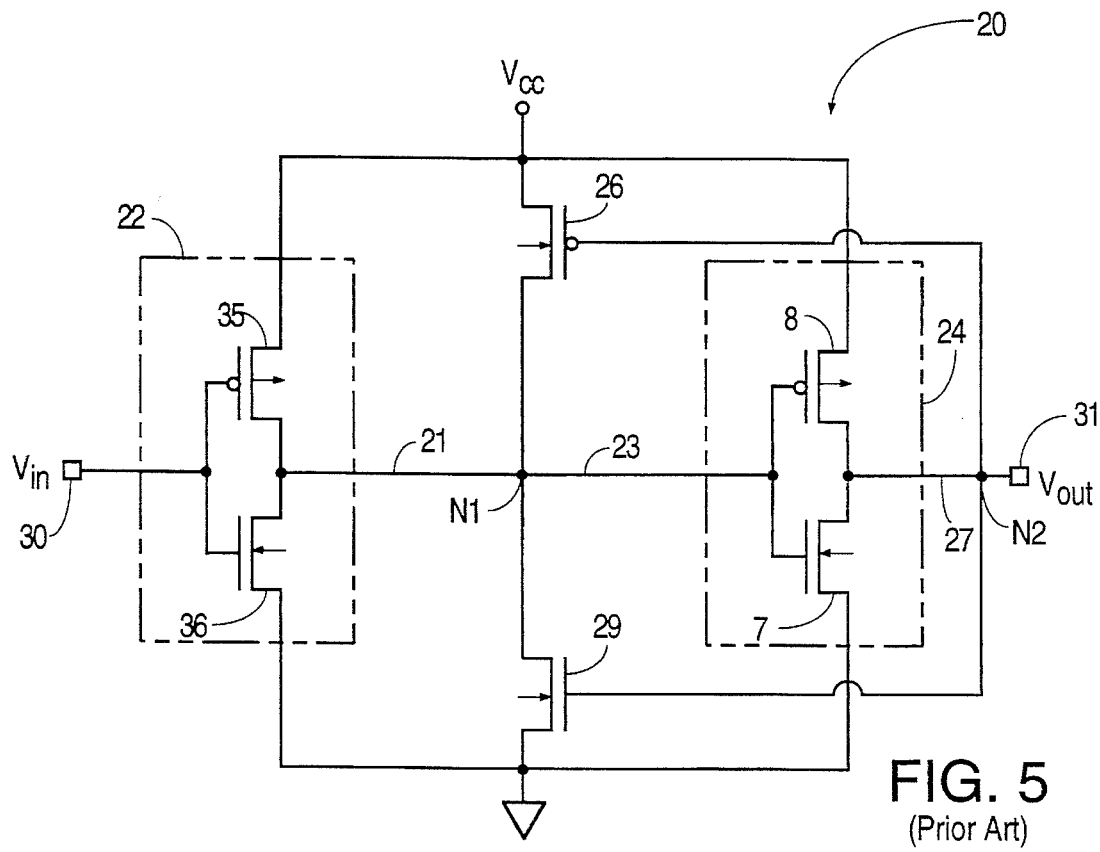
FIG. 5 (PRIOR ART) is an electrical circuit schematic of a hysteresis buffer circuit.

Hysteresis buffer circuit 70 does not have the problem described for hysteresis buffer circuit 20 where, for example, transistor 26 of FIG. 5 does not go into saturation on a low-to-high transition of input voltage $V_{in}$ on input terminal 30. In hysteresis buffer circuit 70, the magnitude of the gate-to-source voltage of P-channel FET 86 decreases as $V_{in}$ increases so that the magnitude of the gate-to-source voltage of P-channel FET 86 will fall so that P-channel FET 86 will saturate. P-channel FET 86 turns off when $V_{in}$ rises so high that the magnitude of the gate-to-source voltage of P-channel FET 86 falls below the threshold voltage of P-channel FET 86.

Figure 8:
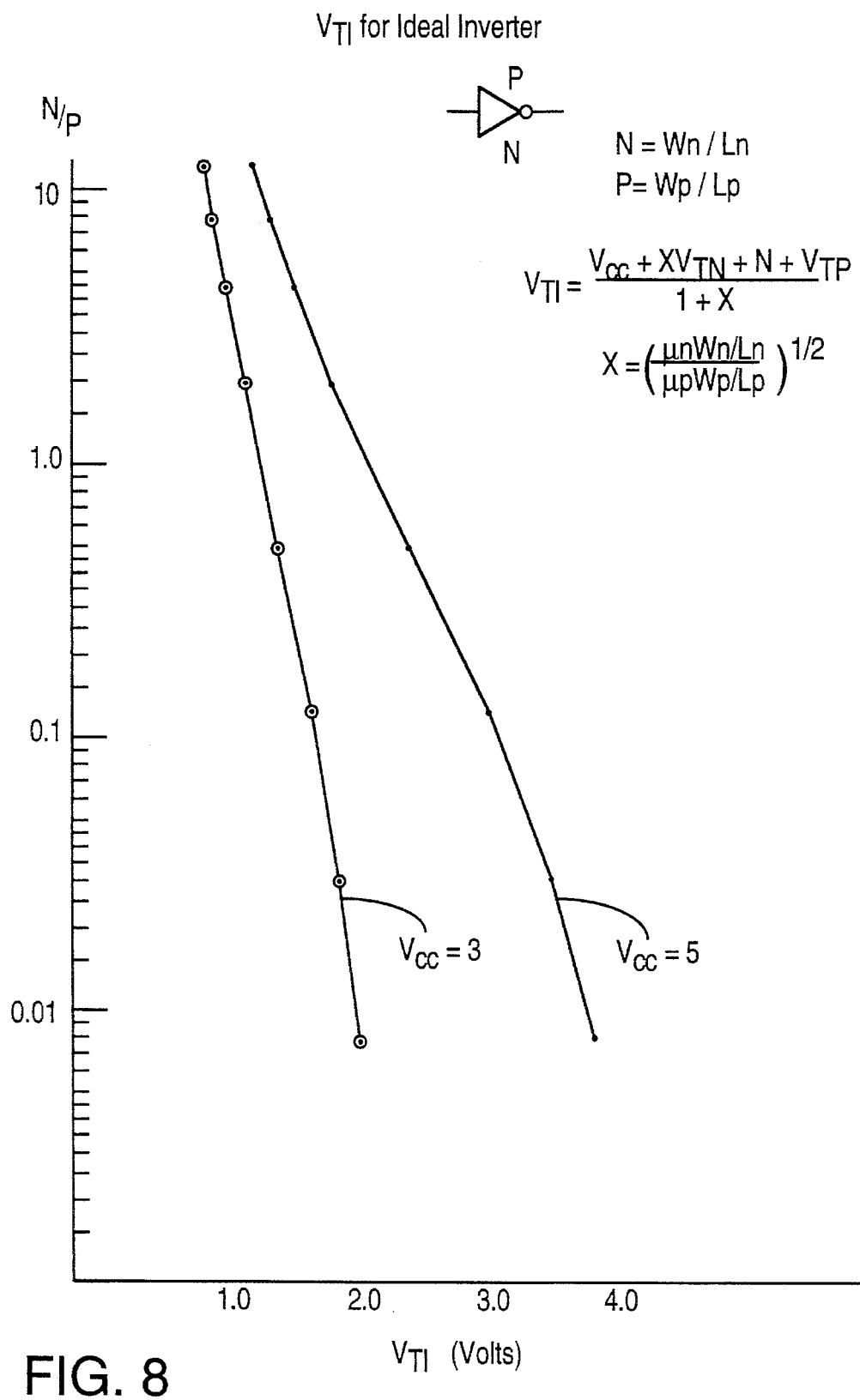
FIG. 8 is a graph of the threshold voltage of an ideal complementary symmetry inverter as a function of the ratio of the N-channel width-to-length ratio to the P-channel width-to-length ratio.

Because a typical transistor's saturation current is proportional to its width-to-length ratio, the $V_{T01}$ and $V_{T10}$ threshold voltages of circuit 70 are related to the width-to-length ratios of the N-channel FETs and the P-channel FETs. The threshold voltages $V_{T01}$ and $V_{T10}$ can be determined for different embodiments of the hysteresis circuit of FIG. 7 having FET transistors of varying sizes. For each transition of the input voltage of an embodiment of hysteresis circuit 70, the aggregate width-to-length ratio of N-channel transistors which are conducting current at each threshold of the hysteresis circuit is determined and the aggregate width-to-length ratio of P-channel transistors which are conducting current at each threshold of the hysteresis circuit is determined. Using these width-to-length ratios, the relationship of FIG. 8 is used to determine the $V_{T01}$ and $V_{T10}$ threshold voltages of the hysteresis circuit.

For a low-to-high input voltage transition, N-channel FETs 80 and 81 are conducting current at threshold and P-channel FETs 75, 76, 86 and 87 are conducting current at threshold. If, for example, the ratio of the aggregate N-channel width-to-length ratio (FETs 80 and 81) to the ratio of the aggregate P-channel width-to-length ratio (FETs 75, 76, 86 and 87) is approximately 0.5, then for a hysteresis buffer circuit operating with a difference of 5.0 volts between a logic 0 and a logic 1, the $V_{T01}$ is approximately 2.5 volts as indicated by FIG. 8.

Similarly, for a high-to-low input voltage transition, N-channel FETs 80, 81, 88, and 89 are conducting current at threshold and P-channel FETs 75 and 76 are conducting current at threshold. If the ratio of the aggregate N-channel width-to-length ratio (FETs 80, 81, 88 and 89) to the aggregate P-channel width-to-length ratio (FETs 75 and 76) is approximately 2.0, then for a hysteresis buffer circuit operating with a difference of 5.0 volts between a logic 0 and a logic 1, the $V_{T10}$ is approximately 1.2 volts as indicated by FIG. 8. Conversely, a circuit designer may choose desired hysteresis threshold voltages and then determine the necessary width-to-length ratios of the FETs 75, 76, 80, 81, 86, 87, 88 and 89 to achieve the chosen hysteresis threshold voltages.

Circuit 70 is but one possible hysteresis circuit in accordance with an embodiment of the present invention. Other circuits are within the scope of the present invention. For example, several FETs connected in parallel can be used in addition to P-channel FET 86. Some or all of these additional FETs can have their gates connected to other control signals to control current flow from the REG supply to the node N5 at the output lead of inverter 71 during low-to-high transitions of the input voltage $V_{in}$. Similarly, several FETs connected in parallel can be used in addition to N-channel FET 89 to conduct current from node N5 to ground during high-to-low transitions of input voltage $V_{in}$.

Figure 9:
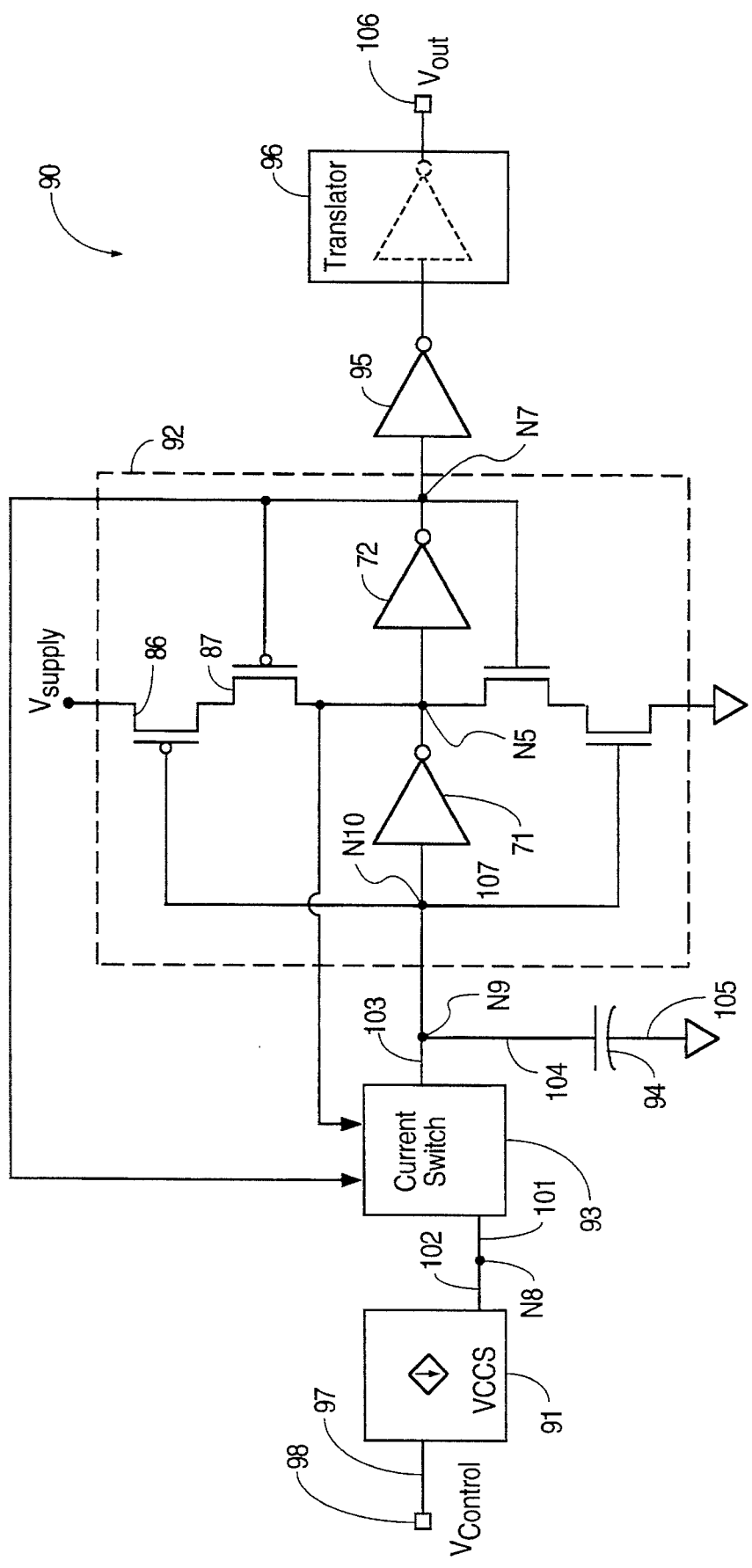
FIG. 9 is a block diagram of a voltage controlled oscillator in accordance with an embodiment of the present invention.

FIG. 9 is a block diagram of a voltage controlled oscillator 90 in accordance with an embodiment of the present invention. Voltage controlled oscillator 90 comprises a voltage-controlled current source 91, a hysteresis buffer circuit 92, a current switch 93, a capacitor 94, an inverter 95, and a voltage translator circuit 96. Hysteresis buffer circuit 92 is identical to the hysteresis buffer circuit 70 of FIG. 7 except that the position of P-channel FETs 86 and 87 are reversed, and the position of N-channel FETs 88 and 89 are reversed.

Voltage-controlled current source 91 receives on an input lead 97 a control voltage $V_{control}$ placed on input terminal 98 which controls the magnitude of the current sourced or sinked by current source 91. An input lead 101 of current switch 93 is coupled to an output lead 102 of voltage-controlled current source 91 at node N8. An output lead 103 of current switch 93 is coupled to a first lead 104 of capacitor 94 at a node N9. A second lead 105 of capacitor 94 is coupled to ground so that capacitor 94 is either charged or discharged depending on how switch 93 is controlled. Switch 93 is controlled by the voltages at nodes N5 and N7 of hysteresis buffer circuit 72. Inverter 95 is identical to inverter 72 of hysteresis buffer circuit 92. Voltage translator 96 scales the voltage signal output from inverter 95 to generate $V_{out}$ at an output terminal 106.

In operation, when $V_{out}$ is at a logic 0, the voltage output from hysteresis buffer circuit 92 is at a logic 0. Current switch 93 therefore is controlled to cause a constant current from voltage-controlled current source 91 to charge capacitor 94. Because capacitor 94 is being charged by a substantially constant current determined by voltage $V_{control}$, the voltage across capacitor 94 increases linearly (according to the general equation: I=C dV/dt). Eventually, the voltage at the input lead 107 of hysteresis buffer circuit 92 reaches $V_{T01}$. The voltage output from hysteresis buffer circuit 92 then transitions from a logic 0 to a logic 1. Inverter 95 supplies a logic 0 to translator 96 so that voltage $V_{out}$ transitions to a logic 1.

The transition of the voltage output from hysteresis buffer circuit 92, however, causes current switch 93 to switch and causes current to be sinked by voltage-controlled current source 91. Capacitor 94 therefore begins discharging. Because the current sinked has a substantially constant magnitude, the voltage across capacitor 94 decreases linearly. Eventually, the voltage across capacitor 94 decreases to the $V_{T10}$ of hysteresis buffer circuit 92. The voltage at node N7 output from hysteresis buffer circuit 92 then transitions from a logic 1 to logic 0. This transition causes inverter 95 to output a logic 1 to translator 96 so that voltage $V_{out}$ transitions from a logic 1 to a logic 0. The entire cycle of charging and discharging capacitor 94 is repeated so that an oscillating output voltage $V_{out}$ is produced at output terminal 106.

Because the voltage output from hysteresis buffer circuit 92 transitions when the input voltage $V_{in}$ reaches the applicable threshold voltage, the frequency of the oscillation depends on the rate that capacitor 94 is charged and discharged. The rate capacitor 94 is charged is directly related to the magnitude of the constant current charging it. Because the substantially constant currents which charge and discharge capacitor 94 are produced by voltage-controlled current source 91, the frequency of voltage controlled oscillator 90 is directly controlled by the magnitude of control voltage $V_{control}$.

Figure 6:
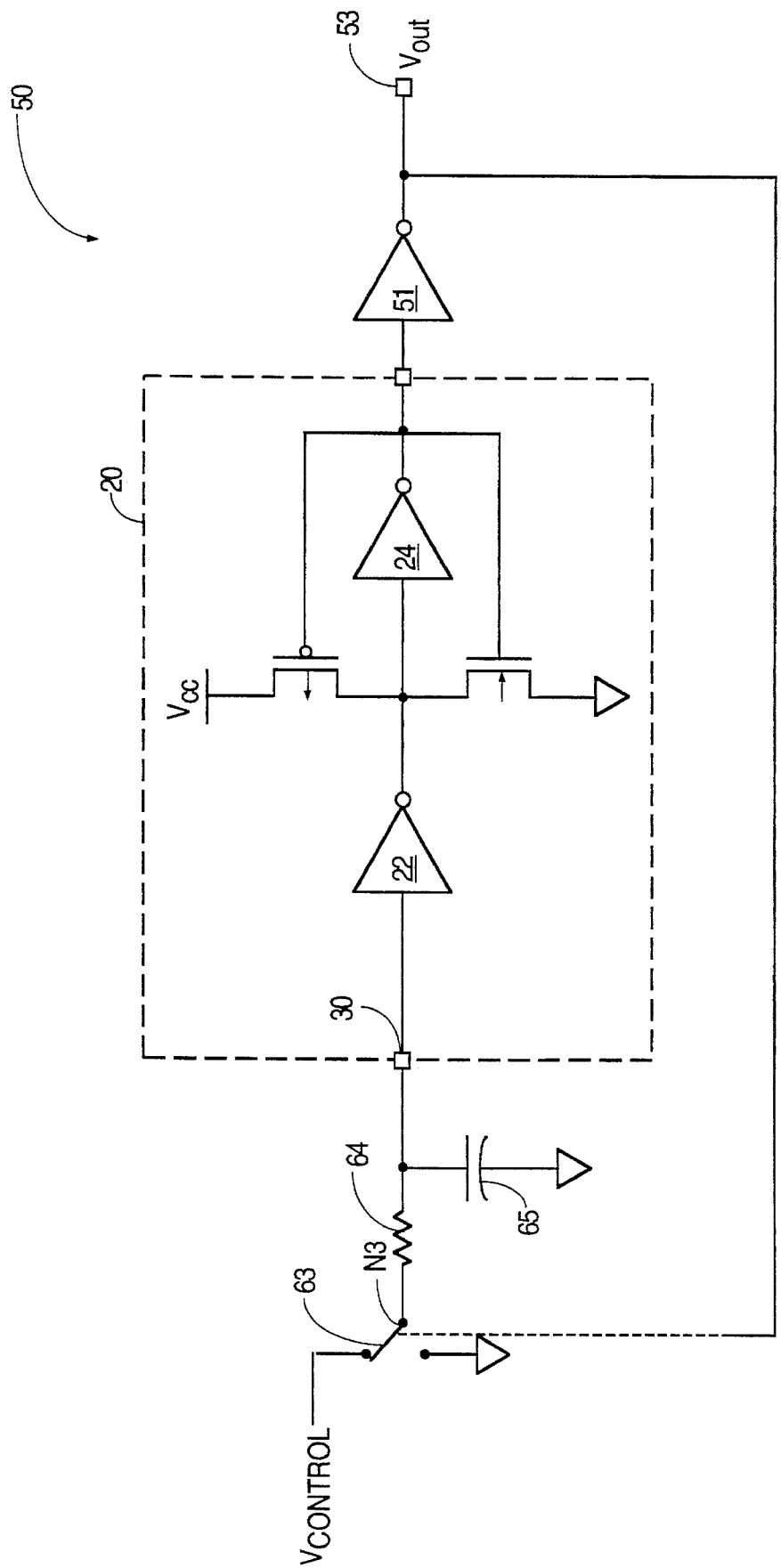
FIG. 6 (PRIOR ART) is a block diagram of a voltage controlled oscillator employing a hysteresis buffer circuit.

Voltage controlled oscillator 90 offers the following advantages over voltage controlled oscillator 50 shown in FIG. 6. In voltage controlled oscillator 90, input voltage $V_{in}$ varies substantially linearly and, thus, the duty cycle of the output voltage $V_{out}$ is easily calculated for a given constant current sourced or sinked by voltage-controlled current source 91 and a given capacitor 94. Further, by controlling the hysteresis voltage thresholds $V_{T01}$ and $V_{T10}$ of hysteresis buffer circuit 92, the duty cycle of the signal $V_{out}$ can be controlled and the parameters of voltage-controlled current source 91 and capacitor 94 can be optimized.

Figure 10A:
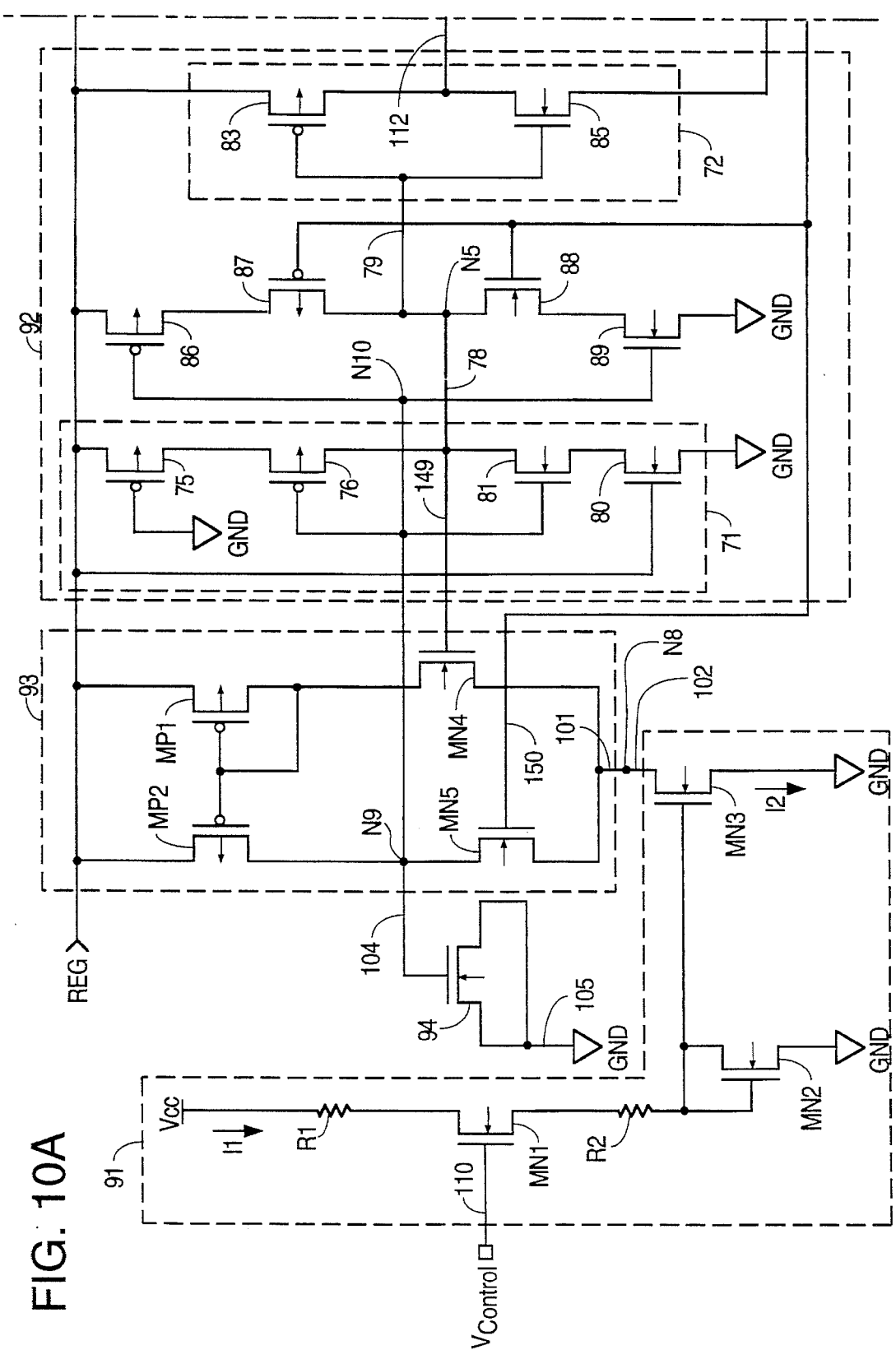
FIG. 10 is an electrical circuit schematic of a voltage controlled oscillator in accordance with an embodiment of the present invention.
Figure 10B:
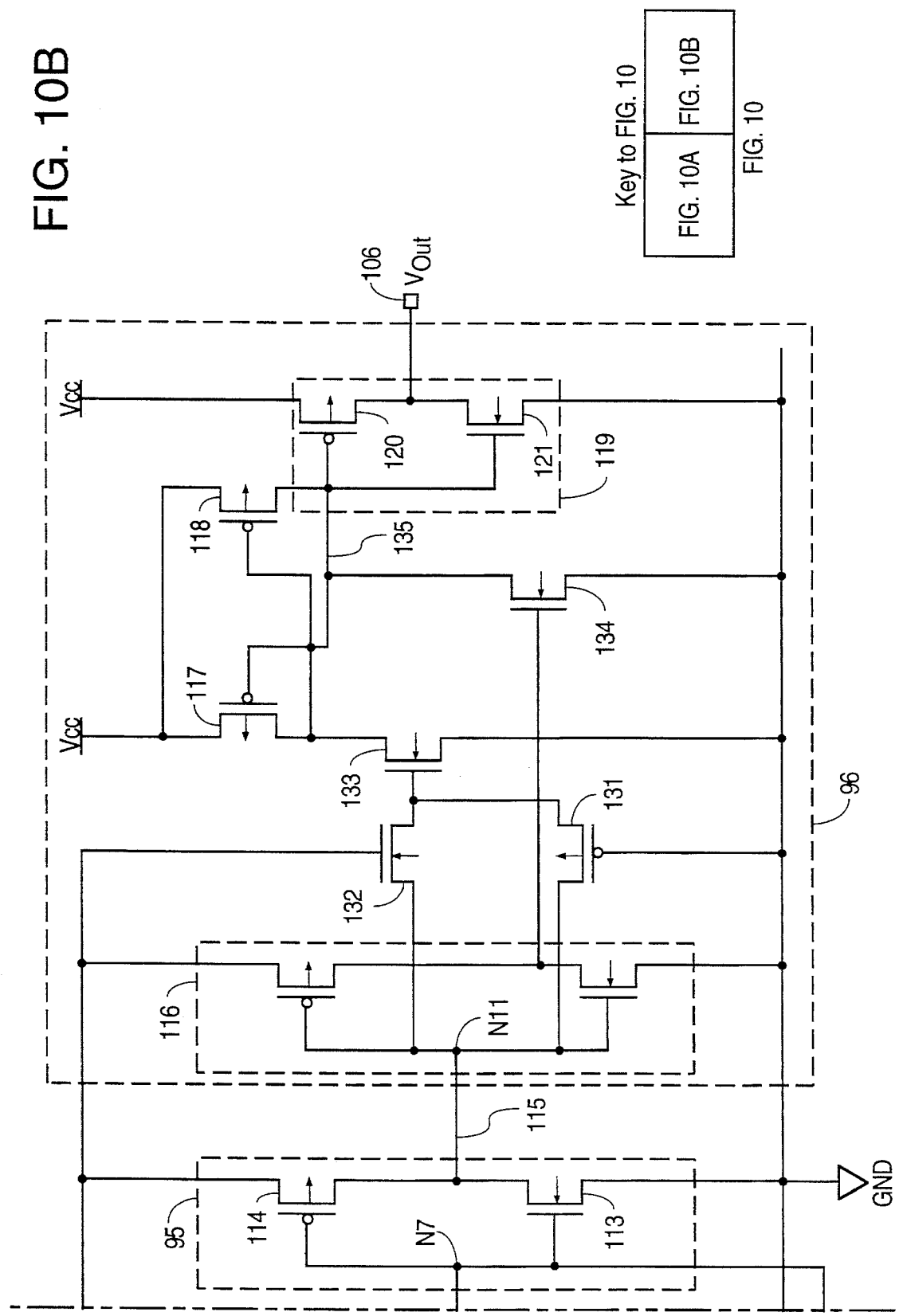

FIG. 10 shows an electrical circuit schematic of a voltage controlled oscillator in accordance with an embodiment of the present invention. The regulated voltage REG is 3.3 volts, and the supply voltage $V_{CC}$ is 5.0 volts. Regulated voltage REG is produced from $V_{CC}$ using a band gap reference circuit (not shown).

Voltage controlled current source 91 comprises resistor R1 (100 ohms), N-channel FET MN1, resistor R2 (1860 ohms), and N-channel FETs MN2 and MN3. In operation, a control voltage $V_{control}$ present on the input lead 110 of voltage-controlled current source 91 is present on the gate of N-channel FET MN1. N-channel FET MN1 produces current I1 for a large range of the control voltage values between $V_{CC}$ and the threshold voltage $V_{TN}$ of N-channel FET MN1. Current I1 is determined by dividing the voltage drop over resistor R2 by the resistance of resistor R2. The voltage drop over resistor R2 is the value of control voltage $V_{control}$ minus the gate-to-source voltage of N-channel FETs MN1 and MN2. N-channel FETs MN2 and MN3 form a current mirror. Accordingly, a larger control voltage $V_{control}$ results in a larger current I1 and a larger mirrored current I2 sinked from output lead 102 of voltage controlled current source 91.

Capacitor 94 has first lead 105 and second lead 104. The first lead 105 is coupled to ground whereas the second lead 104 is coupled to current switch 93 at node N9.

Current switch 93 comprises P-channel FETs MP2 and MP1 and N-channel FETs MN4 and MN5. When capacitor 94 is discharged, the voltage on the input lead of the inverter 71 is a logic 0 and the voltage output by inverter 71 is a logic 1. Because the gate of N-channel FET MN4 is coupled to the output lead 78 of inverter 71, N-channel FET MN4 is conductive. Because the voltage on output lead 78 of inverter 71 is coupled to input lead 79 of inverter 72, and because the output lead 112 of inverter 72 is coupled to the gate of N-channel FET MN5, FET MN5 is nonconductive.

Current switch 93 supplies the current I2 through conductive N-channel FET MN4 and P-channel FET MP1. P-channel FETs MP1 and MP2 form a current mirror where the current through P-channel FET MP1 is mirrored through P-channel FET MP2. P-channel FETs MP1 and MP2 are identical so that the current charging capacitor 94 is equal to current I2. Because current I2 is substantially constant for a given value of control voltage $V_{control}$, the voltage across capacitor 94 increases linearly.

Eventually, the voltage across capacitor 94 reaches the $V_{T01}$ of hysteresis buffer circuit 92. The voltage output by inverter 71 therefore transitions to a logic 0 and the voltage output by inverter 72 transitions to a logic 1. N-channel FET MN4 is therefore turned off and N-channel FET MN5 is turned on. Because N-channel FET MN4 is off, no current flows through the current mirror comprising P-channel FETs MP1 and MP2. Due to N-channel FET MN5 being conductive, N-channel FET MN3 sinks a substantially constant current I2 to discharge capacitor 94 through N-channel FET

MN5.

The voltage across capacitor 94 decreases linearly, and eventually drops below the $V_{T10}$ of hysteresis buffer circuit 92. This causes the voltage output by inverter 71 to transition and also causes the voltage output by inverter 72 to transition. FET MN4 is therefore turned on, FET MN5 is turned off and capacitor 94 is again charged through the current mirror as described above. The cycle of charging and discharging capacitor 94 is repeated so that the voltage across capacitor 94 forms a triangle wave when plotted as a function of time.

The width-to-length ratios of FETs 75, 76, 80, 81 and 86–89 of the hysteresis buffer circuit 92 are chosen so that, together with the linear voltage variation across capacitor 94, hysteresis buffer circuit 92 supplies to inverter 95 an output voltage signal having a very accurate 50% duty cycle.

Output lead 112 of inverter 72 is connected to the input lead of inverter 95 at node N7. Inverter 95 comprises N-channel FET 113 and P-channel FET 114. The output lead of inverter 95 is connected to the input lead 115 of voltage translator 96.

Voltage translator 96 comprises an inverter 116, a cross-coupled latch formed by P-channel FETs 117 and 118, an output inverter 119 formed by FETs 120 and 121, and interconnecting FETs 131–134. Voltage translator 96 operates to scale the 3.3 volt output voltage swings of inverter 95 into 5.0 volt output voltage swings.

In operation, a voltage output by inverter 95 is coupled to the gate of N-channel FET 133 through P-channel FET 131 and N-channel FET 132. FETs 131 and 132 are always on because their gates are tied to ground and the REG supply, respectively. The voltage output from inverter 95 is also inverted by inverter 116, the voltage output from inverter 116 being coupled to the gate of N-channel FET 134. The voltage output from inverter 95 is therefore transformed into a differential input signal which is coupled to the cross-coupled latch formed by P-channel FETs 117 and 118.

When the voltage output from inverter 95 transitions to a logic 1, N-channel FET 133 is turned on and N-channel FET 134 is turned off. This causes P-channel FET 118 to be turned on, and causes the voltage on the input lead 135 of inverter 119 to be pulled high to $V_{CC}$. Because the gate of P-channel FET 117 is coupled to input lead 135 of inverter 119, P-channel FET 117 is turned off, causing the voltage on the drain of P-channel FET 118 to be pulled even harder to $V_{CC}$. Inverter 119 therefore causes the output voltage signal $V_{out}$ output terminal 106 to transition to a logic 0.

In a similar manner, when the voltage output by inverter 95 transitions to logic 0, N-channel FET 134 is turned on and N-channel FET 133 is turned off. This causes the drain of P-channel FET 118 to be coupled to ground which in turn turns P-channel FET 117 on. Because FET 133 is turned off, the voltage on the drain of FET 117 increases to $V_{CC}$ thereby turning FET 118 off. With FET 118 off and FET 134 on, the voltage on input lead 135 of inverter 119 is a logic 0. Inverter 119 therefore outputs a logic 1 onto output terminal 106. Accordingly, voltage translator 96 translates the 3.3 volt (hysteresis buffer circuit receives a 3.3 volt voltage REG and ground) 50% duty cycle squarewave generated by hysteresis buffer circuit 92 into in inverted 5.0 volt (voltage translator 96 receives a 5.0 supply voltage $V_{CC}$ and ground) 50% duty cycle squarewave.

Figure 11:
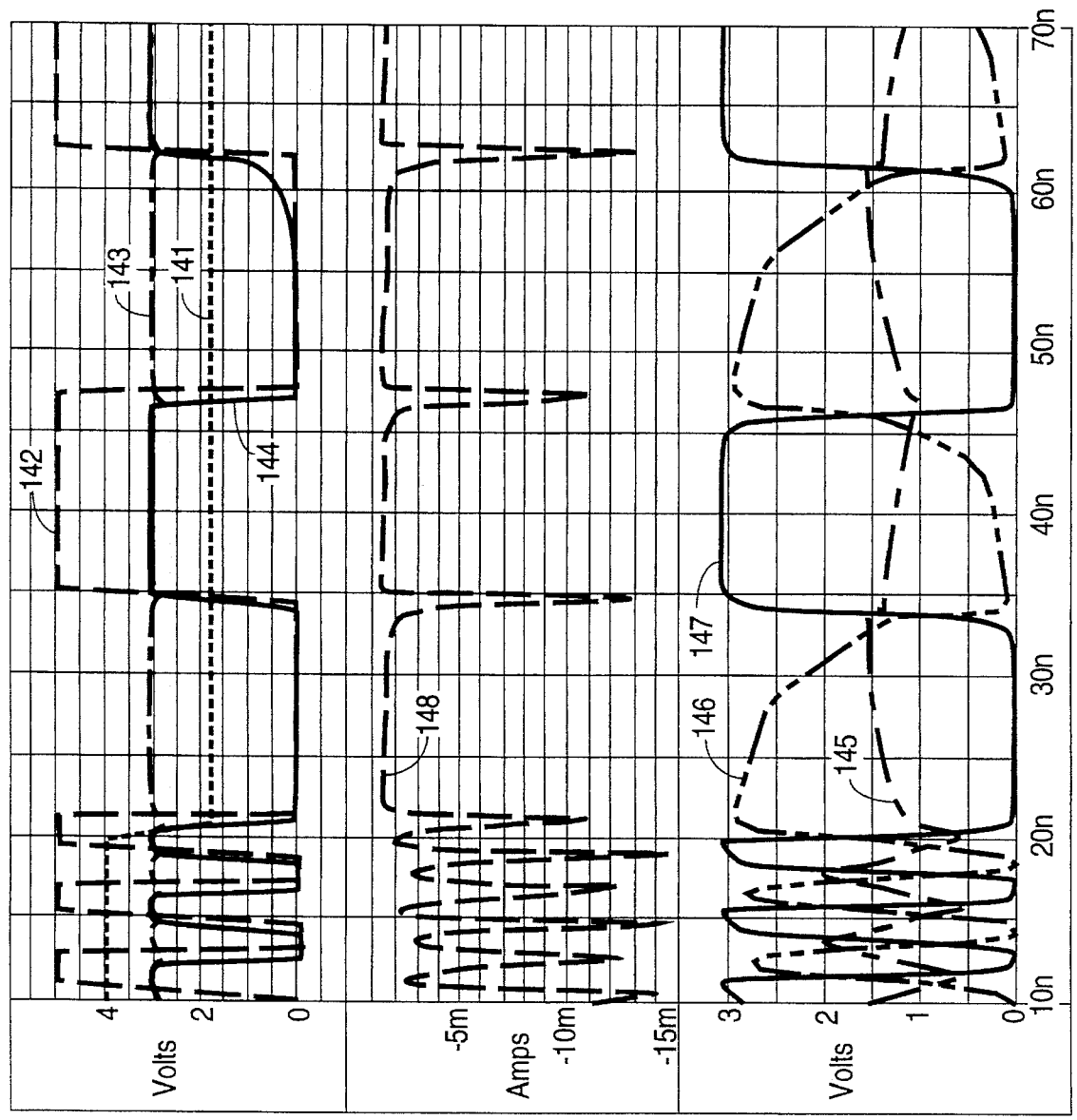
FIG. 11 is a diagram depicting voltages at various points within the circuit of FIG. 10 as predicted by simulation.
Figure 11A:
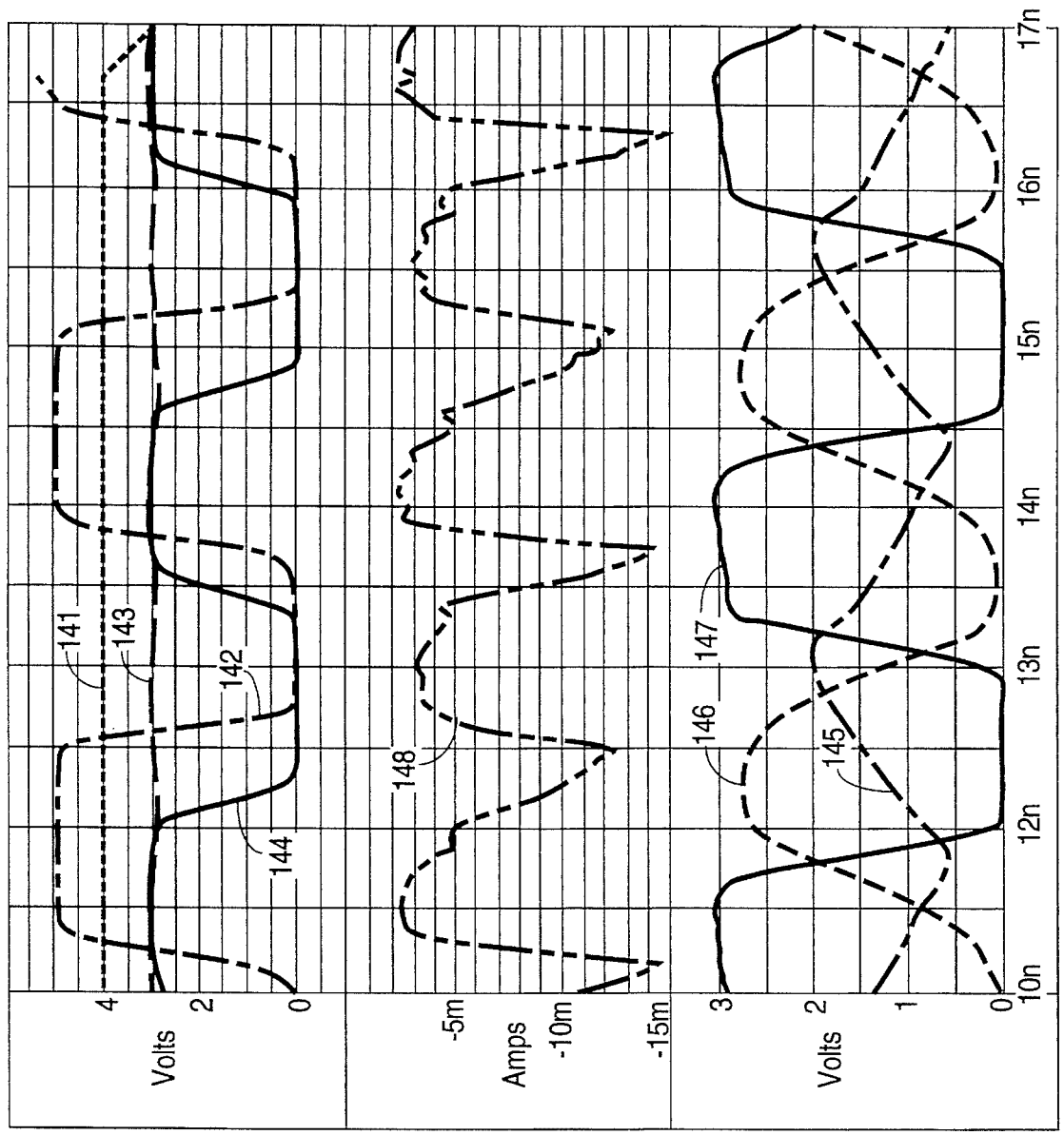
FIG. 11A is a diagram depicting an expanded view of the 10 nanosecond period starting from the 10 nanosecond mark of FIG. 11.

FIGS. 11 and 11A illustrate various voltages within the circuit of FIG. 10. FIG. 11A is an expanded view of the 10 nanosecond period starting from the 10 nanosecond mark of FIG. 11. Waveform 141 represents control voltage $V_{control}$, the input voltage to the circuit 90 of FIG. 10. Waveform 142 represents output voltage $V_{out}$, the output voltage generated by the circuit 90 of FIG. 10 at output terminal 106. When control voltage $V_{control}$ is set to 4.0 volts, output squarewave voltage $V_{out}$ has a shorter period (a frequency of over 230 MHz) as indicated by the waveform 142 during the first 20 nanoseconds illustrated in FIG. 11. When control voltage $V_{control}$ set to 1.8 volts, on the other hand, output squarewave voltage $V_{out}$ has a longer period (a frequency of approximately 37 MHz) as indicated by the waveform 142 after the first 20 nanoseconds illustrated in FIG. 11. Waveform 143 illustrates the voltage of the REG supply. Waveform 144 represents the voltage on node N11 of FIG. 10. Waveform 145 represents voltage at node N10, which is the voltage across capacitor 94. Waveform 146 represents the voltage output by inverter 71 at node N5. Waveform 147 represents the voltage output by hysteresis buffer circuit 92 at node N7. Waveform 148 represents the current supplied to voltage controlled oscillator 90 during operation.

Although the hysteresis threshold voltages of hysteresis buffer circuit 92 are the same during both high frequency and low frequency operation, waveform 145 reveals a change in the peak-to-peak voltage when voltage controlled oscillator 90 output voltage transitions from high to low frequency. This change in peak-to-peak voltage of waveform 145 is caused by the propagation delay through the inverters 71 and 72. Due to this propagation delay, current switch 93 continues to charge (or discharge) capacitor 94 beyond the hysteresis threshold voltage for the duration of this propagation delay which allows the voltage on the input leads 149 and 150 of current switch 93 to "overshoot" the hysteresis threshold voltage. This overshoot is more pronounced during high frequency operation because capacitor 94 is being charged and discharged at a much faster rate because current I2 is larger during high frequency operation. Waveform 145 indicates that capacitor 94 discharges in a slightly non-linear fashion at low frequencies coincident with its transition from charging to discharging (at approximately the 34 nanosecond and 61 nanosecond marks). These notches are caused by the gate capacitances of N-channel FETs MN4 and MN5.

Figure 12:
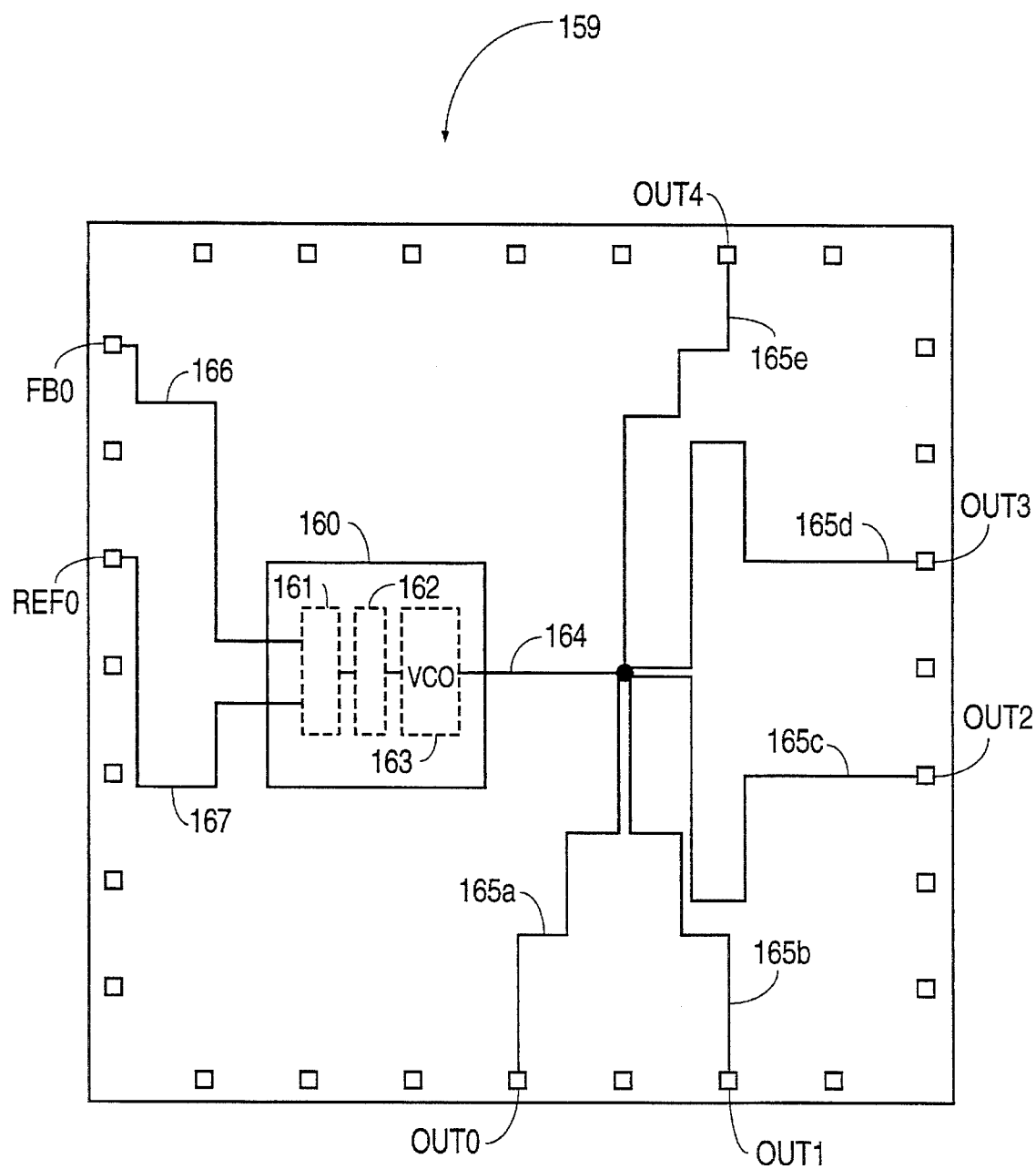
FIG. 12 is a top-down view of a clock generator integrated circuit in accordance with an embodiment of the present invention.

FIG. 12 is a simplified top down view of a clock generator integrated circuit chip employing a phase-locked loop 160 in accordance with an embodiment of the present invention. Phase-locked loop 160 comprises a phase comparator 161, a loop filter 162, and a voltage controlled oscillator 163. The clock generator integrated circuit chip has multiple clock signal output terminals OUT0–OUT4, each of which is coupled to an output lead 164 of the phase-locked loop 160. Output terminals OUT0–OUT4 may, for example, be bonding pads. In order to reduce clock skew between different ones of the clock signals on the clock signal output terminals, the signal paths connecting the output lead 164 of phase-locked loop 160 to the clock signal output terminals of the integrated circuit chip are equalized. In the illustrated embodiment, the signal paths entail conductors 165a–165e. Each of these conductors is made to be the same length, to have the same number of right-hand bends, and to have the same number of left-hand bends. Further, each of these conductors is made to cross the same number of power and ground conductors, thereby equalizing capacitive loading. Due to this equalization, the clock signal generated by phase-locked loop 160 has minimal skew between the clock outputs.

The conductor 166 connecting the feedback input terminal FB0 to phase comparator 161 is also equalized with respect to the conductor 167 connecting the reference clock input terminal REF0 to phase comparator 161 in the same manner described above. This equalization helps minimize skew between the clock outputs and the reference clock.

Figure 13:
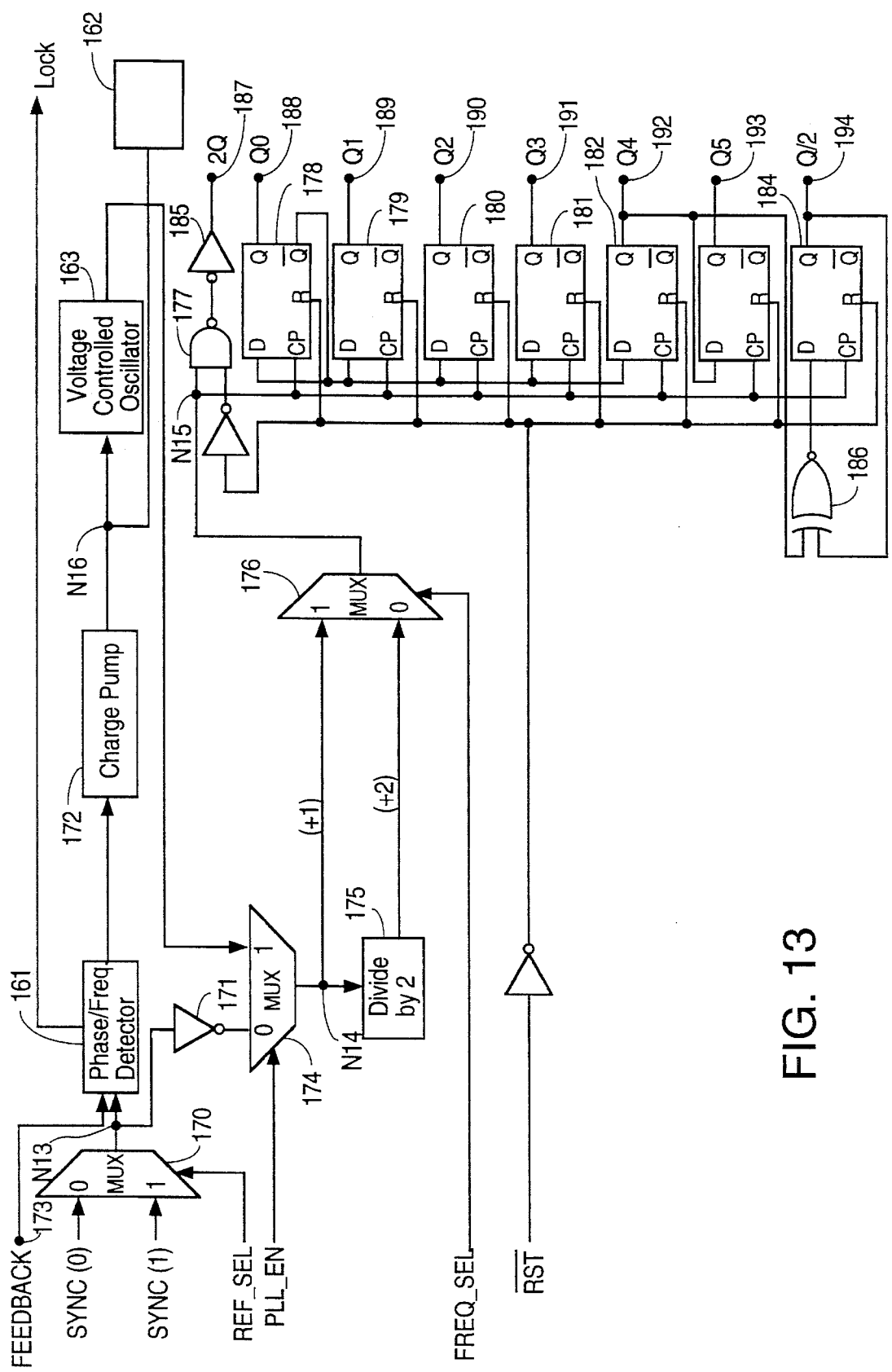
FIG. 13 is a block diagram of a clock generator integrated circuit having eight outputs in accordance with an embodiment of the present invention.

FIG. 13 shows a block diagram of a clock generator integrated circuit having eight outputs according to one embodiment of the present invention.

Multiplexer 170 in the clock generator is controlled by signal REF_SEL to couple either reference signal SYNC(O) or SYNC(1) to node N13, thereby coupling either reference signal SYNC(O) or SYNC(1) to the input of phase detector 161 and to the input of inverter 171. The selected reference signal serves as the reference signal of the phase-locked loop formed by Phase detector 161, charge pump 172, voltage controlled oscillator 163 and loop filter 162. This phase locked loop operates to align the frequency and phase of a FEEDBACK signal present at FEEDBACK terminal 173 to the selected reference signal.

In normal operation, the output signal of the phase-locked loop (i.e., the output of voltage controlled oscillator 163) eventually becomes output signals 2Q, Q0–Q4, Q5 and Q/2, as described below.

In normal operation, PLL_EN signal is high and, thus, multiplexer 174 is controlled to couple the output signal of voltage controlled oscillator 163 to node N14. For test purposes, the PLL_EN signal may be set low to couple the selected reference signal to node N14. Node 14 is coupled to the input of divide-by-2 circuit 175 and to one input of multiplexer 176. The output of divide-by-2 circuit 175 is coupled to the other input of multiplexer 176. Multiplexer 176 is controlled by signal FREQ_SEL to couple either the output signal of voltage controlled oscillator (divide-by-1 signal) or the output signal divided by two (divide-by-2 signal) to node N15 and one input of NAND gate 177 and the clock inputs of D flip flops 178–184.

The reset signal $\overline{RST}$ is normally high causing NAND gate 177 to function as an inverter. As a result, the signal routed to node N15 by multiplexer 176 is inverted twice and becomes output signal 2Q. Because D flip flops 178–182 are configured as divide-by-2 circuits, the Q0–Q4 output of D flip flops 178–182, are in phase with, and one half the frequency of, output signal 2Q. D flip flop 183 is configured as an inverting divide-by-2 circuit and, thus, its Q5 output is one half the frequency and 180 degrees out phase with output signal 2Q. XOR gate and D flip flop 184 form a divide-by-4 circuit and, thus, output signal Q/2, is in phase with, and one fourth the frequency of, output signal 2Q.

The FEEDBACK signal input terminal 173 can be selectively coupled to any of the output terminals 187–194. The output terminals closest to FEEDBACK terminal 173 may be selected to minimize delay.

When output terminal 194 is coupled to FEEDBACK terminal 173, output signal Q/2 serves as the FEEDBACK signal. When, in addition, FREQ_SEL is high, multiplexer 176 selects the divide-by-1 signal and, consequently, the phase-locked loop operates to align the frequency and phase of signal Q/2 to the selected reference signal. Thus, output signals Q0–Q4 are twice the frequency of the selected reference signal and output signal 2Q is four times the frequency.

Similarly, when output terminal 192 is coupled to FEEDBACK terminal 173, output signal Q4 becomes the FEEDBACK signal and output signals Q0–Q4 have the same frequency as the selected reference signal and output signal 2Q is twice the frequency of the selected reference signal.

Thus, in a like manner, the output signal frequencies of the clock generator integrated circuit can be altered as desired by selectively coupling FEEDBACK terminal 173 to one of the output terminals 187–194 and controlling the logic level of the FREQ_SEL and REF_SEL signals.

In some embodiments, loop filter 162 may be external to the clock generating integrated circuit. For example, loop filter 162 may comprise a capacitor coupled between node N16 and ground. Alternatively, loop filter 162 may comprise an RC network.

Figure 14:
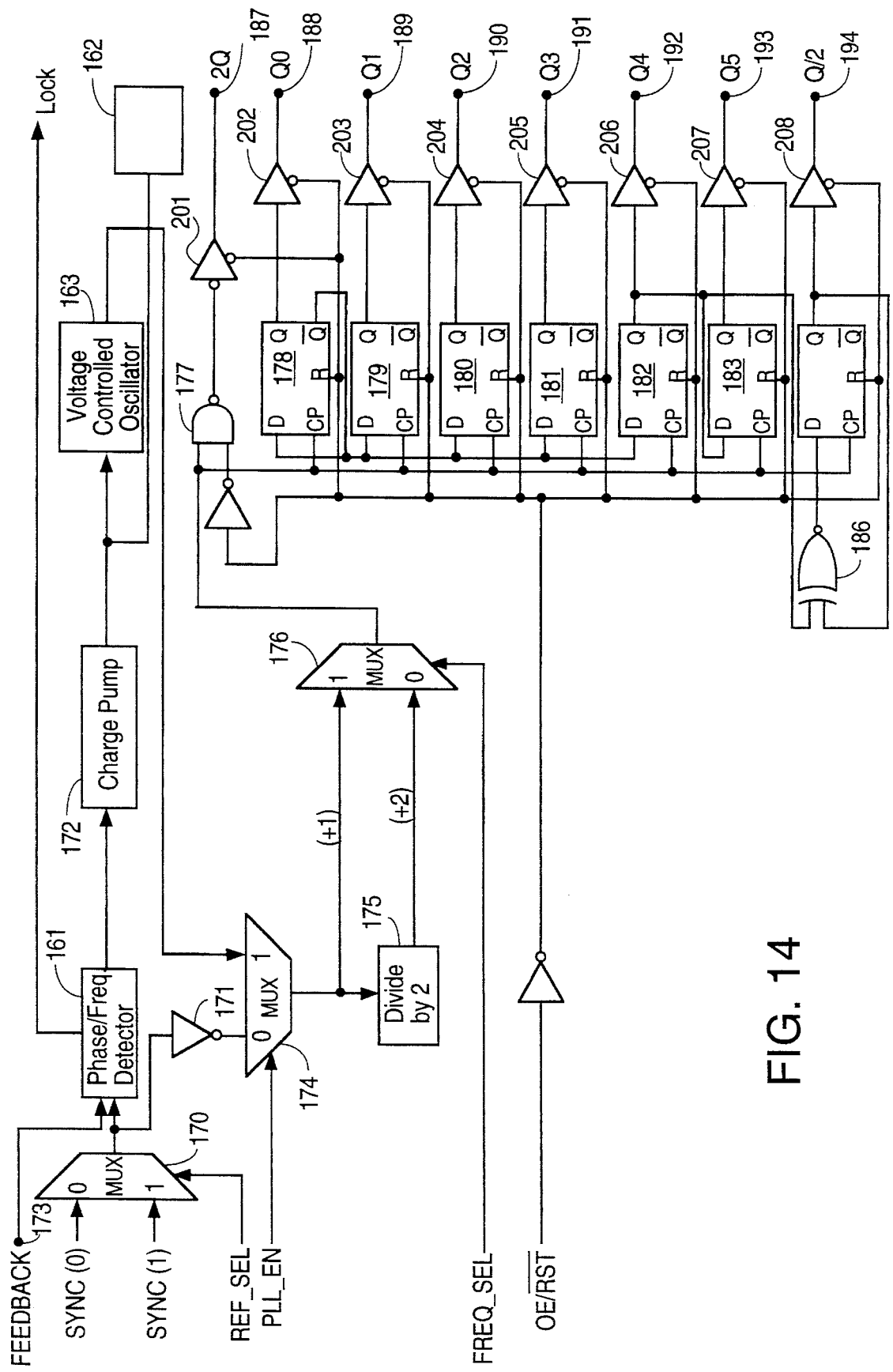
FIG. 14 is a block diagram of a clock generator integrated circuit having eight 3-state output buffers in accordance with an embodiment of the present invention.

FIG. 14 shows a block diagram of a clock generator integrated circuit according to another embodiment of the present invention. This embodiment is identical with the embodiment of FIG. 13 except that a 3-state inverting buffer 201 replaces inverter 185 (FIG. 13), and 3-state buffers 202–208 are coupled to the outputs of D flip flops 178–184, respectively. The 3-state buffers are controlled by signal OE/RST.

Figure 15:
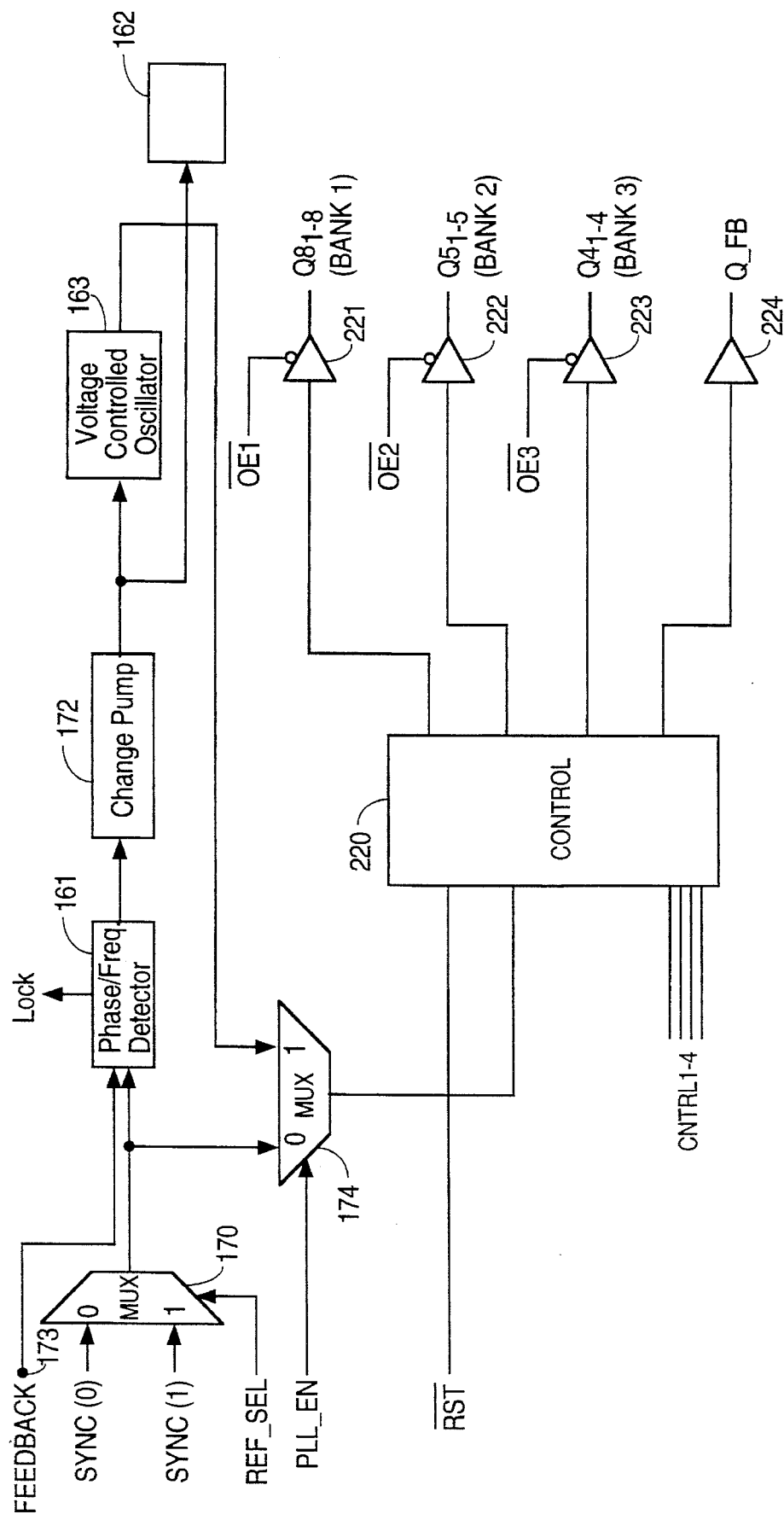
FIG. 15 is a block diagram of a clock generator integrated circuit having eighteen programmable outputs in accordance with an embodiment of the present invention.

FIG. 15 shows a block diagram of a clock generator integrated circuit having 18 programmable outputs according to another embodiment of the present invention. These 18 outputs are divided among BANK 1, BANK 2 and BANK 3. This embodiment is similar to the embodiment of FIG. 14 except that elements 175–184, 186–194 are replaced by control circuit 220 having four control signal inputs. 3-state buffers 201–208 (FIG. 14) are replaced by buffer circuits 221, 222 and 223 corresponding to BANK 1, BANK 2 and BANK 3, respectively. Buffer circuits 221, 222 and 223 are controlled by signals OE1, OE2 and OE3, respectively. This embodiment uses signal Q_FB driven by buffer 224 as a dedicated feedback signal. The output signal frequencies are controlled by the control signals according to Table 1.

TABLE 1

Output Frequency Configuration and Input Frequency Range Table

| MODE | CNTRL 4 | 3 | 2 | 1 | Q_FEEDBACK | Q_BANK1 (8 outputs) | Q_BANK2 (5 outputs) | Q_BANK3 (4 outputs) | FnRANGE |
|---|---|---|---|---|---|---|---|---|---|
| 0 | 0 | 0 | 0 | 0 | F (divide-by-1) | F | F | F | 50–100 MHz |
| 1 | 0 | 0 | 0 | 1 | F (divide-by-1) | F | F/2 | F | 50–100 MHz |
| 2 | 0 | 0 | 1 | 0 | F (divide-by-1) | F | F | F | 50–100 MHz |
| 3 | 0 | 0 | 1 | 1 | F (divide-by-1) | F/2 | F/2 | F | 50–100 MHz |
| 4 | 0 | 1 | 0 | 0 | F (divide-by-1) | F/3 | F | F | 50–100 MHz |
| 5 | 0 | 1 | 0 | 1 | F (divide-by-3) | 3F | F | 3F | 16.6–33.3 MHz |
| 6 | 0 | 1 | 1 | 0 | F (divide-by-3) | F | 3F | 3F | 16.6–33.3 MHz |
| 7 | 0 | 1 | 1 | 1 | F (divide-by-3) | 3F | 3F | 3F | 16.6–33.3 MHz |
| 8 | 1 | 0 | 0 | 0 | F (divide-by-2) | 2F | 2F | 2F | 25–50 MHz |
| 9 | 1 | 0 | 0 | 1 | F (divide-by-2) | F | 2F | 2F | 25–50 MHz |

TABLE 1-continued

Output Frequency Configuration and Input Frequency Range Table

| MODE | CNTRL 4 | 3 | 2 | 1 | Q_FEEDBACK | Q_BANK1 (8 outputs) | Q_BANK2 (5 outputs) | Q_BANK3 (4 outputs) | FnRANGE |
|---|---|---|---|---|---|---|---|---|---|
| 10 | 1 | 0 | 1 | 0 | F (divide-by-2) | F | F | 2F | 25–50 MHz |
| 11 | 1 | 0 | 1 | 1 | F (divide-by-2) | F | F/2 | 2F | 25–50 MHz |
| 12 | 1 | 1 | 0 | 0 | F (divide-by-2) | F/2 | F | 2F | 25–50 MHz |
| 13 | 1 | 1 | 0 | 1 | F (divide-by-4) | 2F | 4F | 4F | 12.5–25 MHz |
| 14 | 1 | 1 | 1 | 0 | F (divide-by-4) | 2F | 2F | 4F | 12.5–25 MHz |
| 15 | 1 | 1 | 1 | 1 | F (divide-by-4) | 2F | F | 4F | 12.5–25 MHz |

In some embodiments, the clock skew between any of the clock output signals present on the output terminals is less than 0.2 nanoseconds at a clock frequency less than or equal to 133 MHz over a temperature range of 0 to 75 degrees Celsius and a supply voltage range of 4.75 to 5.25 volts.

In other embodiments, the clock skew between any of the clock output signals present on the output terminals is less than 0.2 nanoseconds at a clock frequency less than or equal to 150 MHz over a temperature range of 0 to 75 degrees Celsius and a supply voltage range of 3.0 to 3.6 volts.

In other embodiments, the clock skew between any of the clock output signals and the reference clock signal supplied to reference clock signal input terminal is less than 0.5 nanoseconds at a clock frequency less than or equal to 133 MHz over a temperature range of 0 to 70 degrees Celsius and a supply voltage range of 4.75 to 5.25 volts.

In other embodiments, the clock skew between any of the clock output signals and the reference clock signal supplied to reference clock signal input terminal is less than 0.5 nanoseconds at a clock frequency less than or equal to 150 MHz over a temperature range of 0 to 70 degrees Celsius and a supply voltage range of 3.0 to 3.6 volts.

Although the present invention has been described by way of the presently described preferred embodiments, the invention is not limited thereto. Adaptations and modifications may be practiced without departing from the spirit and scope of the invention. For example, junction field effect transistors may be substituted for IGFETs. The hysteresis buffer circuit, the voltage controlled oscillator, and the clock generator integrated circuit chip may be adapted for manufacturing in technologies other than CMOS technology. Various selected features of the hysteresis buffer circuit, the voltage controlled oscillator, and/or the clock generator integrated circuit chip may be combined to adapt the hysteresis buffer circuit, the voltage controlled oscillator, and/or the clock generator integrated circuit chip to different applications. The above description is therefore presented merely for illustrative instructional purposes and is not intended to limit the scope of the invention as set forth in the appended claims.

I claim:

1. An oscillator of a monolithic integrated circuit, comprising:

a voltage controlled current source;

a current switch having a first input lead, a first control lead, and an output lead, said first input lead being coupled to said voltage controlled current source;

a capacitor having a first lead and a second lead, said first lead being coupled to said output lead of said current switch, said second lead being coupled to a supply of substantially constant voltage;

a logic gate having an input lead and an output lead, said input lead of said logic gate coupled to said first lead of said capacitor, said logic gate comprising:

a first complementary symmetry logic section having an input lead and an output lead, said input lead of said first complementary symmetry logic section being coupled to said input lead of said logic gate;

a hysteresis control section having a first input lead, a second input lead, and an output lead, said first input lead of said hysteresis control section being coupled to said input lead of said first complementary symmetry logic section, said output lead of said hysteresis control section being coupled to said output lead of said first complementary symmetry logic section; and a second complementary symmetry logic section having an input lead and an output lead, said input lead of said second complementary symmetry logic section being coupled to said output lead of said first complementary symmetry logic section, said output lead of said second complementary symmetry logic section being connected to said first control lead of said current switch.

2. The oscillator of claim 1, wherein said hysteresis control section comprises:

a field effect transistor having a gate and a drain, said gate of said field effect transistor being connected to said input lead of said first complementary symmetry logic section, said drain of said field effect transistor being connected to said output lead of said first complementary symmetry logic section.

3. The oscillator of claim 1, wherein said hysteresis control section comprises:

a field effect transistor having a gate and a source, said gate of said field effect transistor being connected to said input lead of said first complementary symmetry logic section, said source of said field effect transistor being coupled to a supply of substantially constant voltage.

4. The oscillator of claim 1, wherein said hysteresis control section comprises:

a first field effect transistor having a gate, a source and a drain, said drain of said first field effect transistor being coupled to said output lead of said first complementary symmetry logic section;

a second field effect transistor of the same conductivity type as said first field effect transistor, said second field effect transistor having a gate, a source and a drain, said drain of said second field effect transistor being coupled to said source of said first field effect transistor, said gate of said first field effect transistor being coupled to one of said input lead of said first complementary symmetry logic section and said output lead of said logic gate, said gate of said second field effect transistor being coupled to the other of said input lead of said first complementary symmetry logic section and said output lead of said logic gate;

a third field effect transistor of opposite conductivity type to said first field effect transistor, said third field effect transistor having a gate, a source and a drain, said drain of said third field effect transistor being coupled to said output lead of said first complementary symmetry logic section; and a fourth field effect transistor of the same conductivity type as said third field effect transistor, said fourth field effect transistor having a gate, a source and a drain, said drain of said fourth field effect transistor being coupled to said source of said third field effect transistor, said gate of said third field effect transistor being coupled to one of said input lead of said first complementary symmetry logic section and said output lead of said logic gate, said gate of said fourth field effect transistor being coupled to the other of said input lead of said first complementary symmetry logic section and said output lead of said logic gate.

5. The oscillator of claim 1, wherein said hysteresis control section conducts a first current between a first supply of substantially constant voltage and said output lead of said first complementary symmetry logic section during a low-to-high voltage transition on said input lead of said first complementary symmetry logic section, and wherein said hysteresis control section conducts a second current between said output lead of said first complementary symmetry logic section and a second supply of substantially constant voltage during a high-to-low voltage transition on said input lead of said first complementary symmetry logic section.

6. The oscillator of claim 5, wherein said second supply of substantially constant voltage supplies ground potential, and wherein said first supply of substantially constant voltage supplies a potential of approximately 3.3 volts.

7. The oscillator of claim 1 wherein said output lead of second complementary symmetry logic section is connected to said output lead of said logic gate.

8. The oscillator of claim 1 wherein said logic gate is a non-inverting logic gate.

9. The oscillator of claim 1 further comprising a translator circuit having an input lead coupled to said output lead of logic gate and having an output lead connected to an output lead of said oscillator.

10. The oscillator of claim 1 wherein said first complementary symmetry logic section comprises a first complementary symmetry inverter, and wherein said second complementary symmetry logic section comprises a second complementary symmetry inverter.

11. The oscillator of claim 10, wherein said first complementary symmetry inverter section comprises an N-channel field effect transistor and a P-channel field effect transistor, and wherein said hysteresis control section comprises a P-channel field effect transistor and an N-channel field effect transistor.

12. The oscillator of claim 11, wherein said N-channel transistor of said hysteresis control section, said P-channel transistor of said hysteresis control section, said N-channel transistor of said first complementary symmetry inverter, and said P-channel transistor of said first complementary symmetry inverter have width-to-length ratios selected such that a first hysteresis threshold voltage $V_{T01}$ of said logic gate is set to a first predetermined value and such that a second hysteresis threshold voltage $V_{T10}$ of said logic gate is set to a second predetermined value.

13. The oscillator of claim 12 wherein said first hysteresis threshold voltage $VT_{01}$ and said second hysteresis threshold voltage $VT_{10}$ are set to values that cause said oscillator to output a oscillating signal having a predetermined duty cycle.

14. The oscillator of claim 13 wherein said predetermined duty cycle is substantially equal to 50%.

15. An oscillator of a monolithic integrated circuit, comprising:

a voltage controlled current source;

a current switch having a first input lead, a first control lead, and an output lead, said first input lead being coupled to said voltage controlled current source;

a capacitor having a first lead and a second lead, said first lead being coupled to said output lead of said current switch, said second lead being coupled to a supply of substantially constant voltage;

a first complementary symmetry logic section having an input lead and an output lead, said input lead of said first complementary symmetry logic section being coupled to said first lead of said capacitor;

a hysteresis control section having a first input lead, a second input lead, and an output lead, said first input lead of said hysteresis control section being coupled to said input lead of said first complementary symmetry logic section, said output lead of said hysteresis control section being coupled to said output lead of said first complementary symmetry logic section; and a second complementary symmetry logic section having an input lead and an output lead, said input lead of said second complementary symmetry logic section being coupled to said output lead of said first complementary symmetry logic section, said output lead of said second complementary symmetry logic section being coupled to said first control lead of said current switch, wherein said current switch comprises a differential current switch, said current switch also having a second control lead, said second control lead of said current switch being coupled to said output lead of said first complementary symmetry logic section.

16. An oscillator of a monolithic integrated circuit, comprising:

a voltage controlled current source;

a current switch having a first input lead, a first control lead, and an output lead, said first input lead being coupled to said voltage controlled current source;

a capacitor having a first lead and a second lead, said first lead being coupled to said output lead of said current switch, said second lead being coupled to a supply of substantially constant voltage;

a first complementary symmetry logic section having an input lead and an output lead, said input lead of said first complementary symmetry logic section being coupled to said first lead of said capacitor;

a hysteresis control section having a first input lead, a second input lead, and an output lead, said first input lead of said hysteresis control section being coupled to said input lead of said first complementary symmetry logic section, said output lead of said hysteresis control section being coupled to said output lead of said first complementary symmetry logic section; and a second complementary symmetry logic section having an input lead and an output lead, said input lead of said second complementary symmetry logic section being coupled to said output lead of said first complementary symmetry logic section, said output lead of said second complementary symmetry logic section being coupled to said first control lead of said current switch, wherein said first complementary symmetry logic section comprises a first P-channel field effect transistor, a second P-channel field effect transistor, a first N-channel field effect transistor and a second N-channel field effect transistor, a gate of said first P-channel field effect transistor being coupled to a supply of substantially constant voltage, a gate of said first N-channel field effect transistor being coupled to another supply of substantially constant voltage supply, a gate of said second P-channel field effect transistor and a gate of said second N-channel field effect transistor being coupled together, a drain of said second P-channel field effect transistor being coupled to a drain of said second N-channel field effect transistor.

* * * * *